US012564027B2

(12) United States Patent
Smith et al.

(10) Patent No.: US 12,564,027 B2
(45) Date of Patent: Feb. 24, 2026

(54) TOP-DOWN SELF-ALIGNMENT OF VIAS IN A SEMICONDUCTOR DEVICE FOR SUB-22NM PITCH METALS

(71) Applicant: Tokyo Electron Limited, Tokyo (JP)

(72) Inventors: Jeffrey Smith, Clifton Park, NY (US); David Power, Saratoga Springs, NY (US); Eric Chih-Fang Liu, Niskayuna, NY (US); Anton J. Devilliers, Clifton Park, NY (US); Kandabara Tapily, Mechanicsville, NY (US); Jodi Grzeskowiak, Schenectady, NY (US); David Conklin, Saratoga Springs, NY (US); Michael Murphy, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 497 days.

(21) Appl. No.: 18/308,230

(22) Filed: Apr. 27, 2023

(65) Prior Publication Data

US 2023/0352343 A1    Nov. 2, 2023

Related U.S. Application Data

(60) Provisional application No. 63/335,394, filed on Apr. 27, 2022.

(51) Int. Cl.
*H01L 21/768*        (2006.01)
*H01L 21/033*        (2006.01)
(Continued)

(52) U.S. Cl.
CPC .... *H01L 21/76897* (2013.01); *H01L 21/0337* (2013.01); *H01L 21/31144* (2013.01);
(Continued)

(58) Field of Classification Search
CPC ........... H01L 21/76897; H01L 21/0337; H01L 21/31144; H01L 21/76811; H01L 21/76816; H01L 23/5226; H01L 21/76808
See application file for complete search history.

(56) References Cited

U.S. PATENT DOCUMENTS 9,837,314 B2    12/2017    Smith et al.
11,031,287 B2    6/2021    Tapily et al.
(Continued)

*Primary Examiner* — Ratisha Mehta
*Assistant Examiner* — Sophia W Kao
(74) *Attorney, Agent, or Firm* — Oblon, McClelland, Maier & Neustadt, L.L.P.

(57)        ABSTRACT

A process includes forming, over a dielectric layer, a hard-mask stack including a first layer below a second layer below a third layer below a fourth layer. The first and third layers include a different hardmask material from the second and fourth layers. A trench pattern including sidewall spacer structures is formed over the hardmask stack. The fourth layer is etched in a first region. The fourth and third layers are etched in a second region. The fourth and third layers are etched in a third region. The fourth layer is etched in a fourth region. The second and first layers are etched in the second and third regions. The third layer is etched in the first and fourth regions. In the dielectric layer, trenches are formed in the first and fourth regions, and via openings, deeper than the trenches, are formed in the second and third regions.

20 Claims, 29 Drawing Sheets

(51) Int. Cl.
　　*H01L 21/311* 　　　　(2006.01)
　　*H01L 23/522* 　　　　(2006.01)

(52) U.S. Cl.
　　CPC .. *H01L 21/76811* (2013.01); *H01L 21/76816*
　　　　　　　　(2013.01); *H01L 23/5226* (2013.01)

(56) References Cited

U.S. PATENT DOCUMENTS

| | | | |
|---|---|---|---|
| 2017/0221760 A1* | 8/2017 | Smith | H01L 21/0332 |
| 2020/0006140 A1* | 1/2020 | Tapily | H01L 21/76843 |
| 2021/0265208 A1* | 8/2021 | Yang | H01L 21/76807 |
| 2021/0305087 A1* | 9/2021 | Parikh | H01L 21/32139 |
| 2022/0181205 A1* | 6/2022 | Briggs | H01L 21/76834 |

* cited by examiner

100

100

100
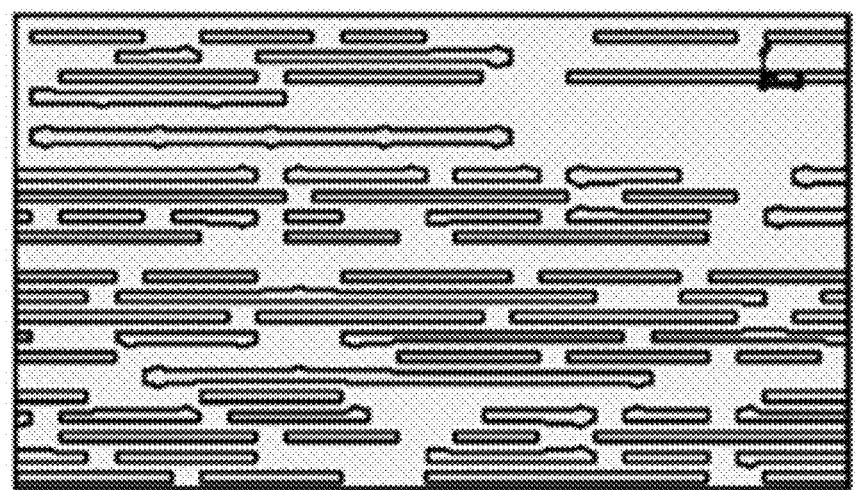
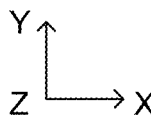
Figure 1C
100
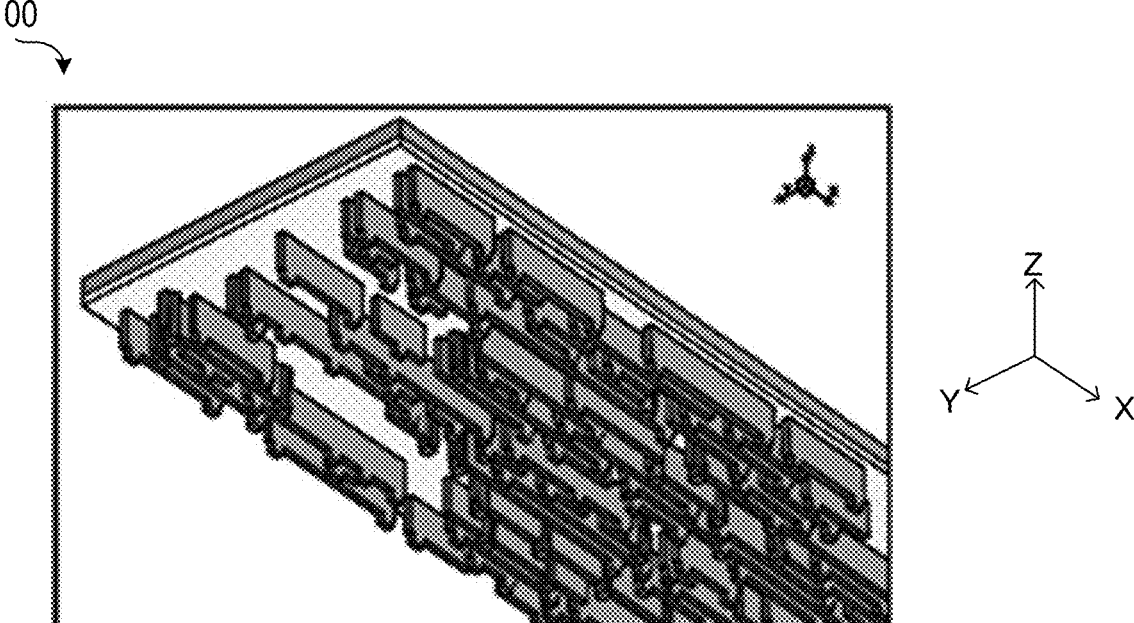
Figure 1D

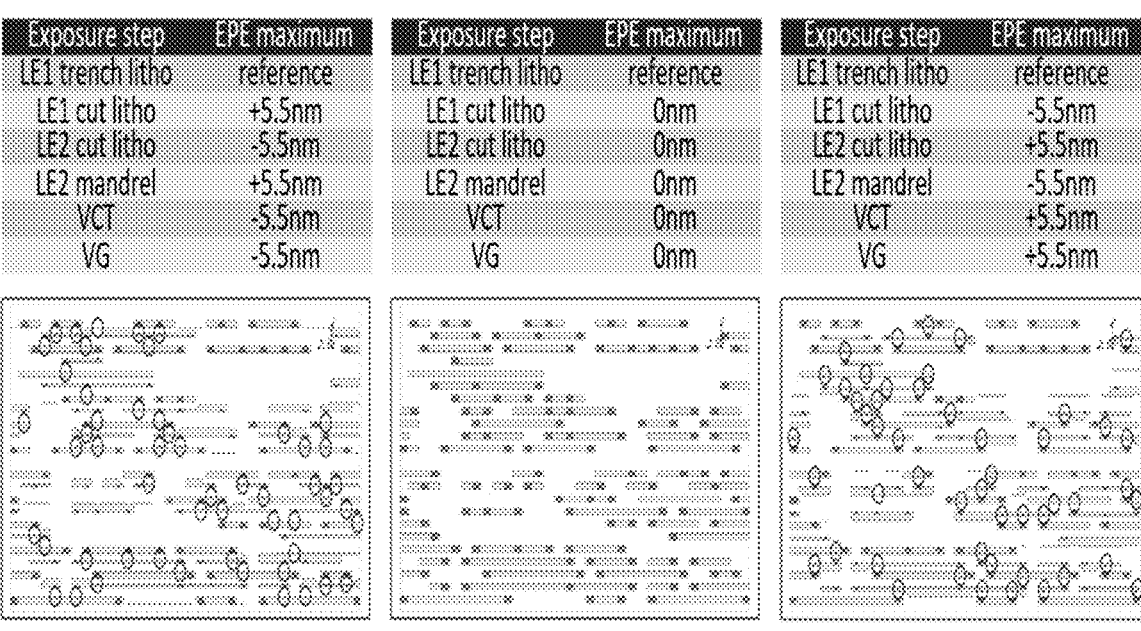

| Exposure step | EPE maximum |
|---|---|
| LE1 trench litho | reference |
| LE1 cut litho | +5.5nm |
| LE2 cut litho | -5.5nm |
| LE2 mandrel | +5.5nm |
| VCT | -5.5nm |
| VG | -5.5nm |

| Exposure step | EPE maximum |
|---|---|
| LE1 trench litho | reference |
| LE1 cut litho | 0nm |
| LE2 cut litho | 0nm |
| LE2 mandrel | 0nm |
| VCT | 0nm |
| VG | 0nm |

| Exposure step | EPE maximum |
|---|---|
| LE1 trench litho | reference |
| LE1 cut litho | -5.5nm |
| LE2 cut litho | +5.5nm |
| LE2 mandrel | -5.5nm |
| VCT | +5.5nm |
| VG | +5.5nm |

Figure 3A

| Exposure step | EPE maximum |
|---|---|
| LE1 trench litho | reference |
| LE1 cut litho | +4.5nm |
| LE2 cut litho | -4.5nm |
| LE2 mandrel | +4.5nm |
| VCT | -4.5nm |
| VG | -4.5nm |

| Exposure step | EPE maximum |
|---|---|
| LE1 trench litho | reference |
| LE1 cut litho | 0nm |
| LE2 cut litho | 0nm |
| LE2 mandrel | 0nm |
| VCT | 0nm |
| VG | 0nm |

| Exposure step | EPE maximum |
|---|---|
| LE1 trench litho | reference |
| LE1 cut litho | -4.5nm |
| LE2 cut litho | +4.5nm |
| LE2 mandrel | -4.5nm |
| VCT | +4.5nm |
| VG | +4.5nm |

Figure 3B

| Exposure step | EPE maximum |
|---|---|
| LE1 trench litho | reference |
| LE1 cut litho | +4.0nm |
| LE2 cut litho | -4.0nm |
| LE2 mandrel | +4.0nm |
| VCT | -4.0nm |
| VG | -4.0nm |

| Exposure step | EPE maximum |
|---|---|
| LE1 trench litho | reference |
| LE1 cut litho | 0nm |
| LE2 cut litho | 0nm |
| LE2 mandrel | 0nm |
| VCT | 0nm |
| VG | 0nm |

| Exposure step | EPE maximum |
|---|---|
| LE1 trench litho | reference |
| LE1 cut litho | -4.0nm |
| LE2 cut litho | +4.0nm |
| LE2 mandrel | -4.0nm |
| VCT | +4.0nm |
| VG | +4.0nm |

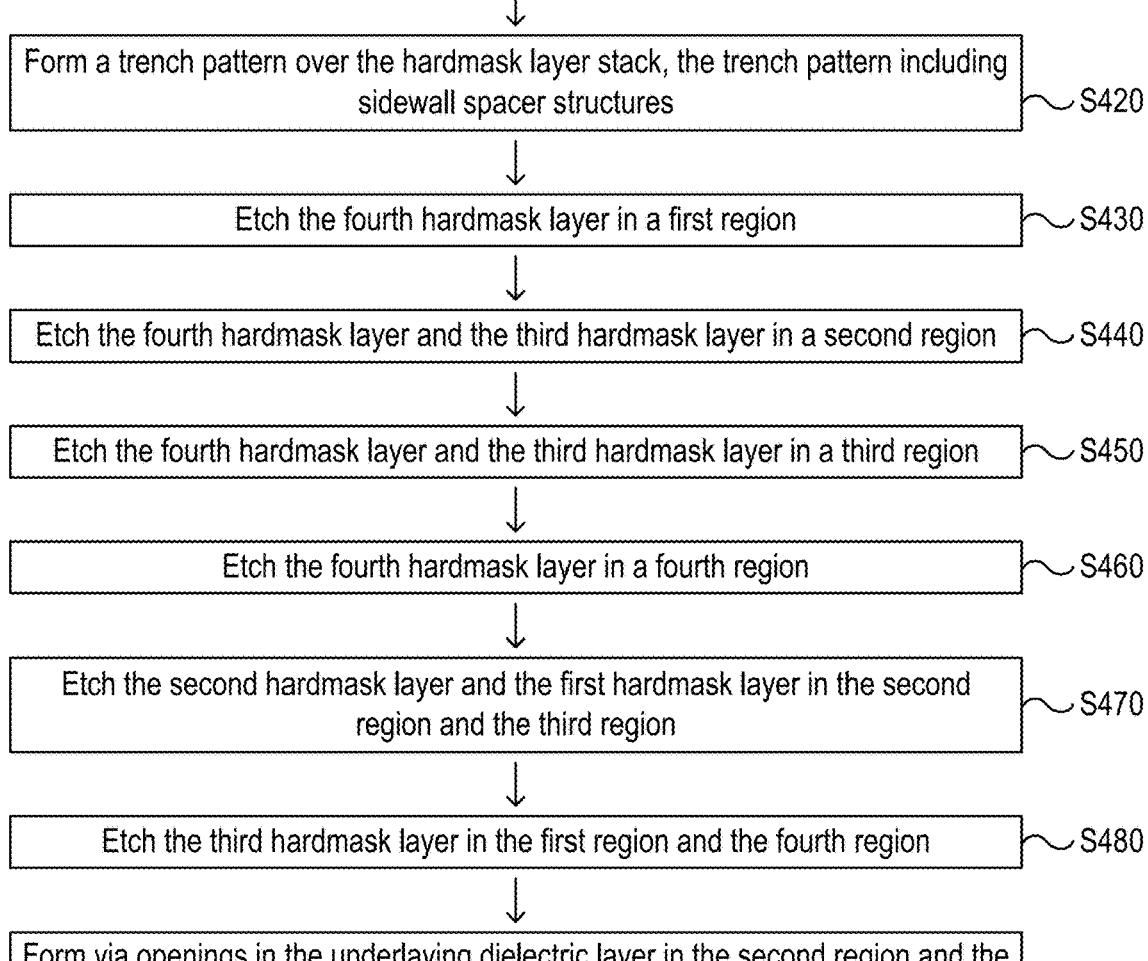

Start

Form a hardmask layer stack over an underlaying dielectric layer, the hardmask layer stack comprising a first hardmask layer, a second hardmask layer formed over the first hardmask layer, a third hardmask layer formed over the second hardmask layer, and a fourth hardmask layer formed over the third hardmask layer, wherein the first hardmask layer and the third hardmask layer comprise a first hardmask material, the second hardmask layer and the fourth hardmask layer comprise a second hardmask material, and the first hardmask material and the second hardmask material are configured to be etch-selective to each other    S410

Form a trench pattern over the hardmask layer stack, the trench pattern including sidewall spacer structures    S420

Etch the fourth hardmask layer in a first region    S430

Etch the fourth hardmask layer and the third hardmask layer in a second region    S440

Etch the fourth hardmask layer and the third hardmask layer in a third region    S450

Etch the fourth hardmask layer in a fourth region    S460

Etch the second hardmask layer and the first hardmask layer in the second region and the third region    S470

Etch the third hardmask layer in the first region and the fourth region    S480

Form via openings in the underlaying dielectric layer in the second region and the third region, and trenches in the underlaying dielectric layer in the first region and the fourth region, wherein the via openings are deeper than the trenches    S490

End

600
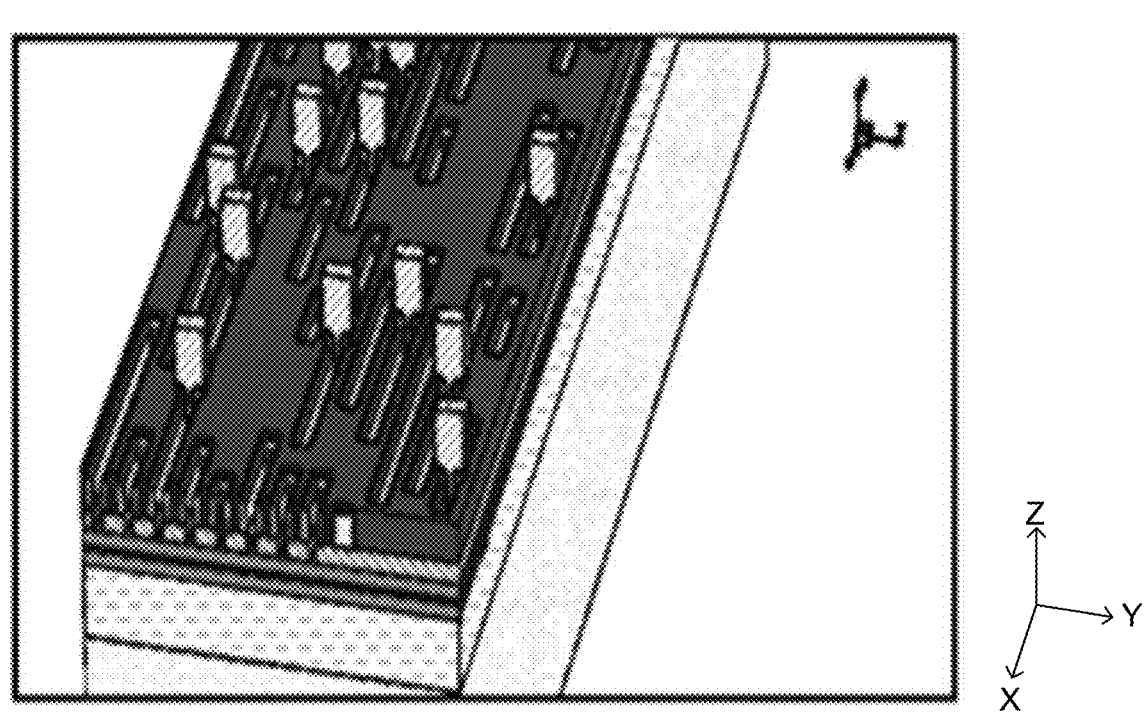
Figure 8B
600
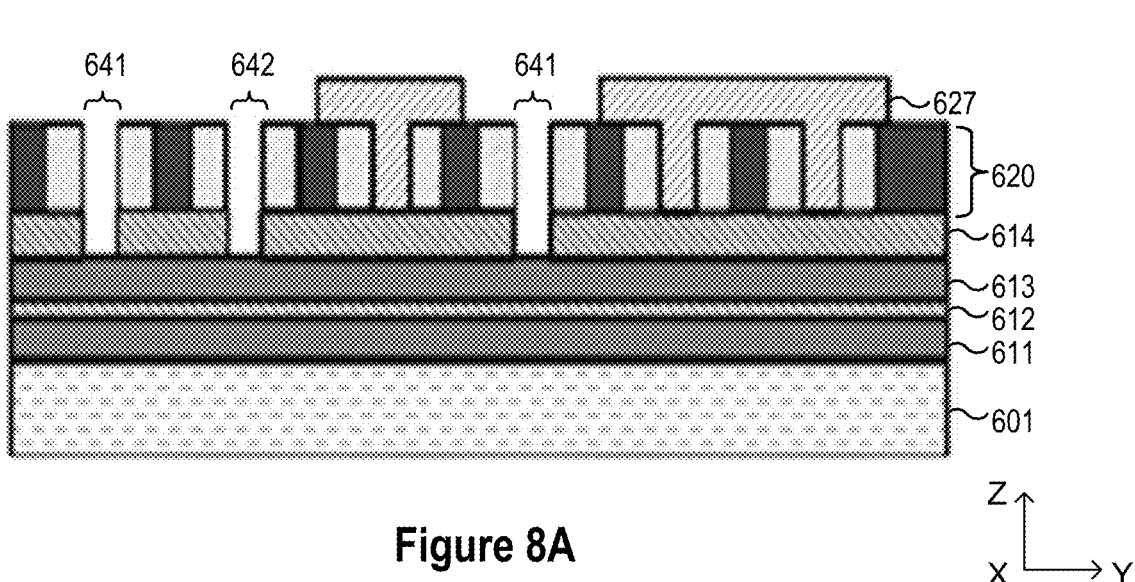
Figure 8A

600

600

600

600

600

600

600

600

600

Z
Y
X

600

641   643   642   625        641        643        621

620
614
613
612
611
601

Z
X   Y

600

600

600

600

600

600

600

600

627   629

635
627
620
614
613
612
611
601

600

600

600

600

600

600

600
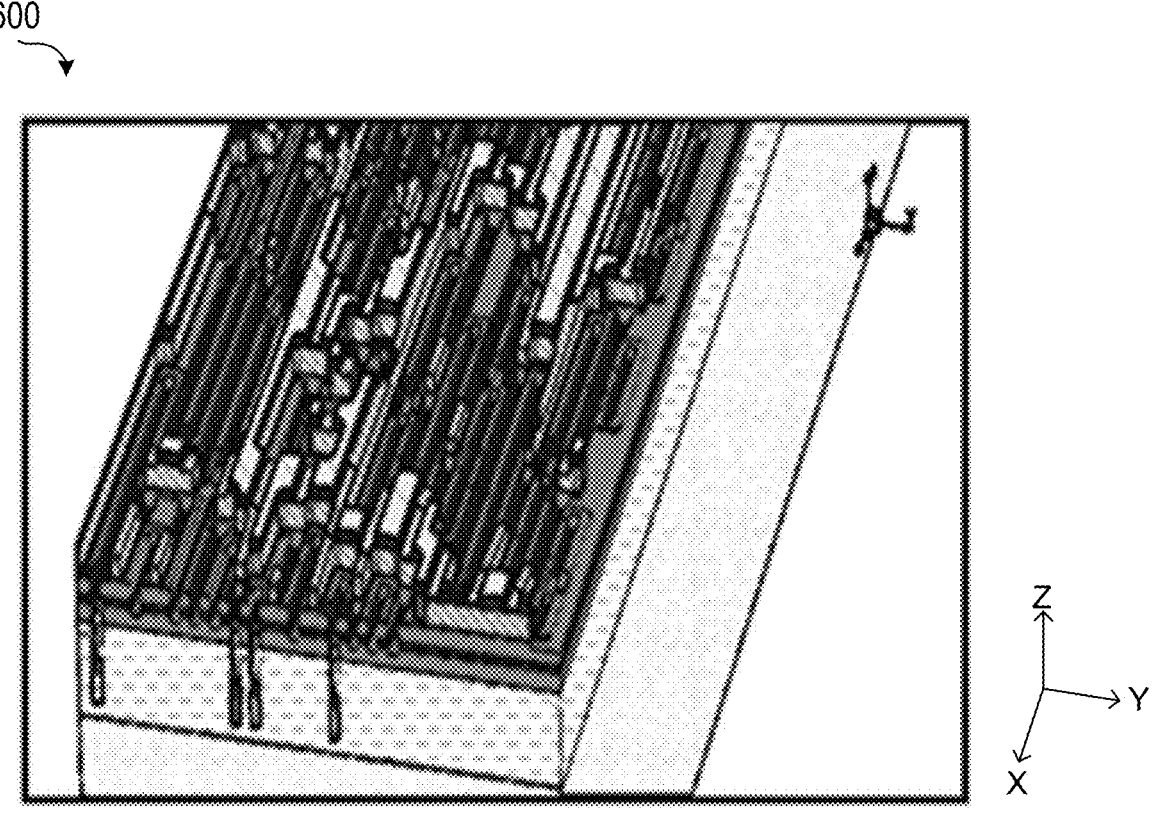
Figure 21B
600
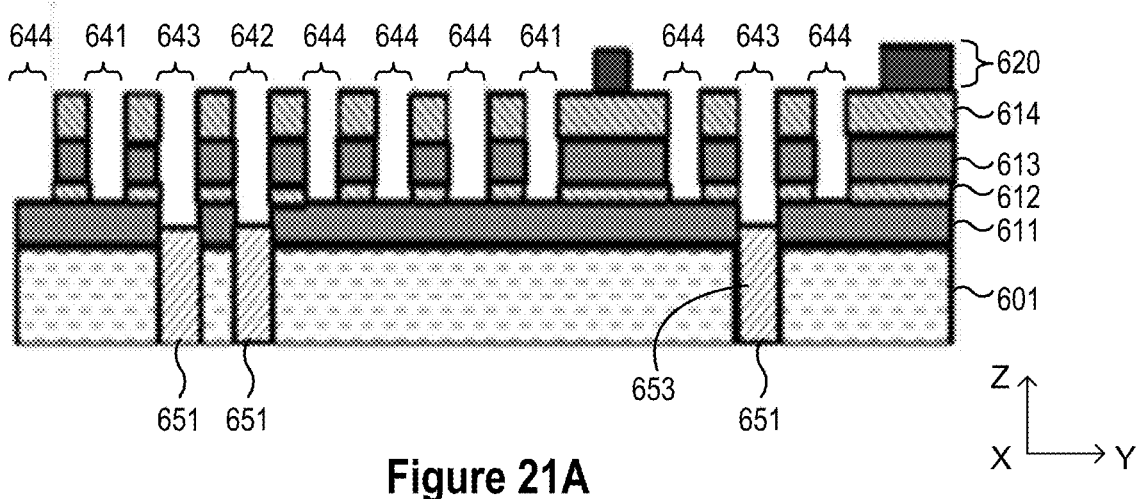
Figure 21A

600
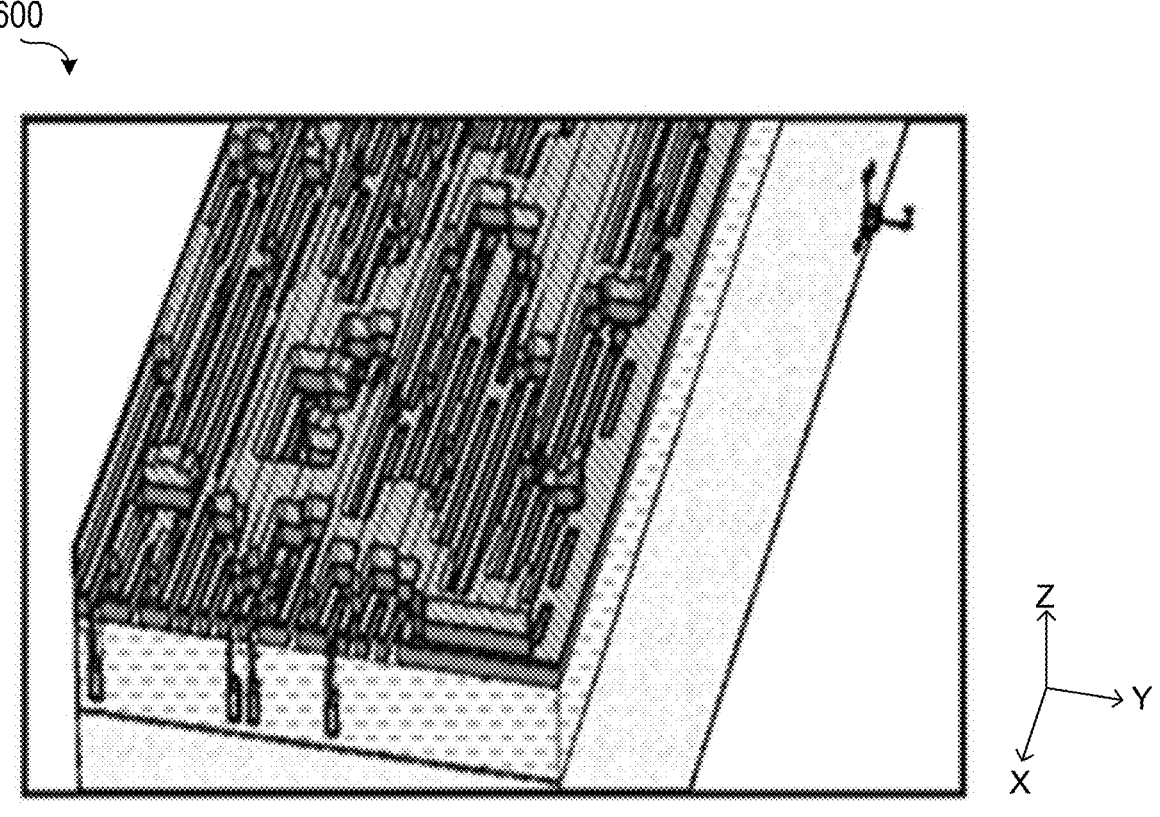
Figure 22B
600
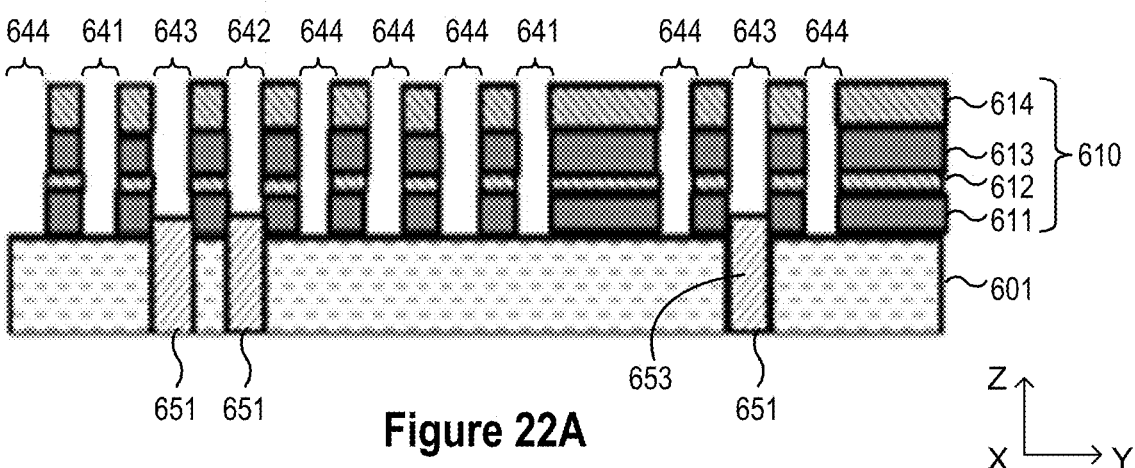
Figure 22A

600
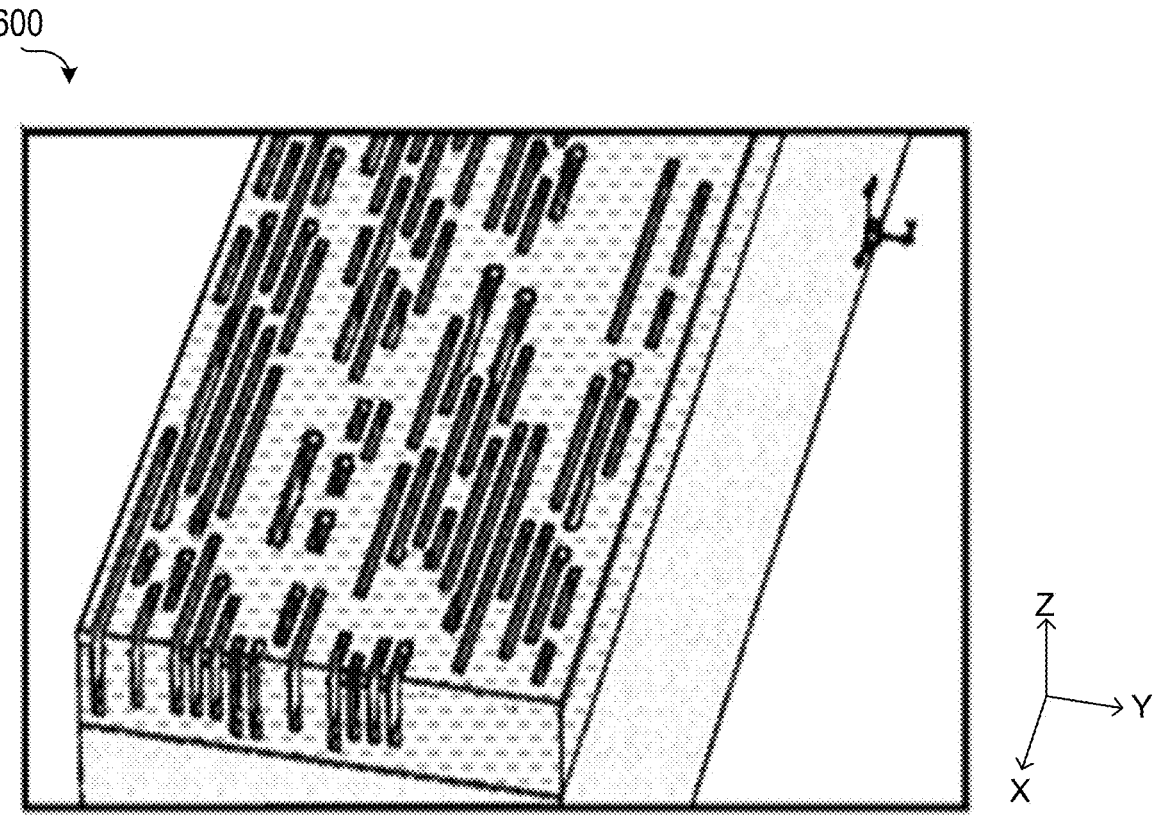
Figure 23B
600
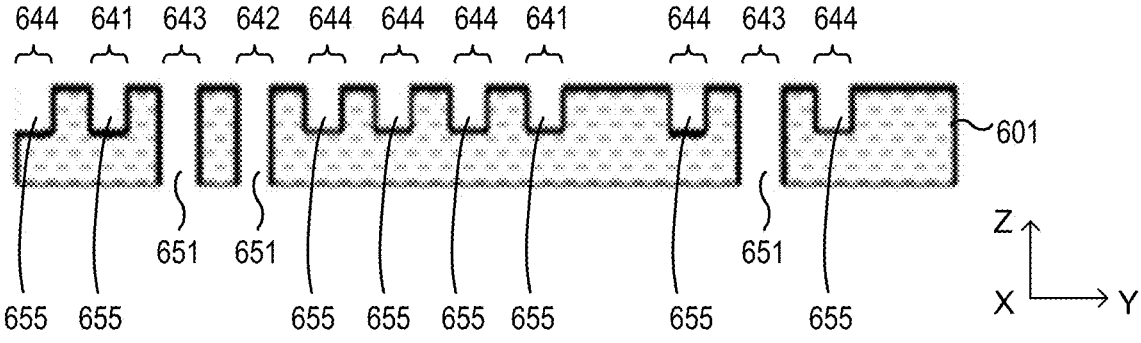
Figure 23A

600
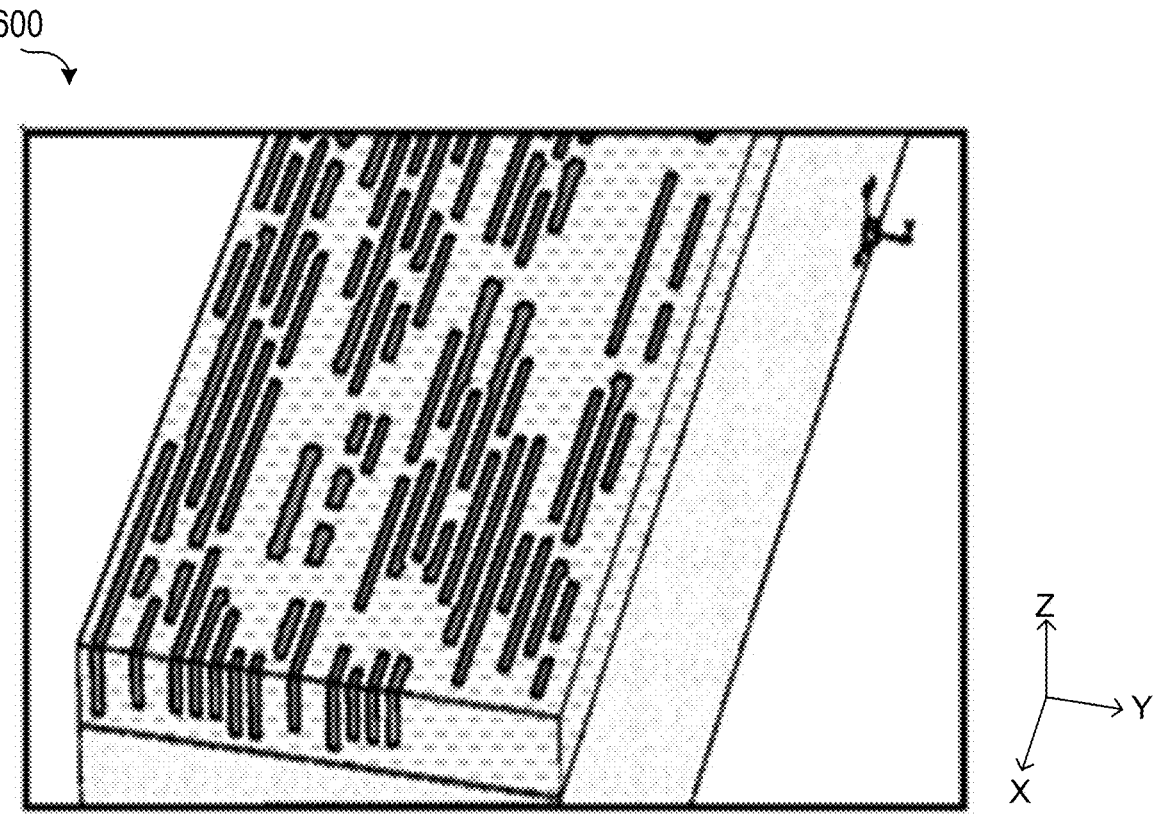
Figure 24B
600
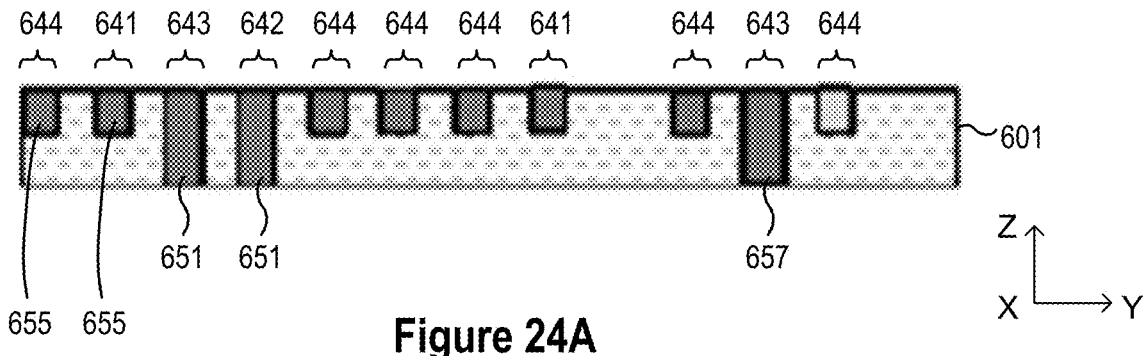
Figure 24A

TOP-DOWN SELF-ALIGNMENT OF VIAS IN A SEMICONDUCTOR DEVICE FOR SUB-22NM PITCH METALS

INCORPORATION BY REFERENCE

This present disclosure claims the benefit of U.S. Provisional Application No. 63/335,394, filed on Apr. 27, 2022, which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. In U.S. Pat. No. 9,837,314 titled "Self-alignment of metal and via using selective deposition" and U.S. Pat. No. 11,031, 287 titled "Fully self-aligned via with selective bilayer dielectric regrowth", Applicant demonstrated the capability to drive self-alignment between a via structure connecting down to a bottom metal layer. The benefits of this integration process are shown to be (a) the ability to oversize the via structure in order to reduce resistance while still ensuring a full connection to the underlying metal, and (b) the ability to provide a full connection between the via and bottom metal layer through nominal edge placement errors (EPE) associated with the integration process in terms of critical dimension uniformity (CDU) or misalignment of either structure.

SUMMARY

The present disclosure relates to a method of patterning for microfabrication.

The method includes forming a hardmask layer stack over an underlying dielectric layer. The hardmask layer stack includes a first hardmask layer, a second hardmask layer formed over the first hardmask layer, a third hardmask layer formed over the second hardmask layer, and a fourth hardmask layer formed over the third hardmask layer. The first hardmask layer and the third hardmask layer include a first hardmask material. The second hardmask layer and the fourth hardmask layer include a second hardmask material. The first hardmask material and the second hardmask material are configured to be etch-selective to each other. A trench pattern including sidewall spacer structures is formed over the hardmask layer stack. The fourth hardmask layer is etched in a first region. The fourth hardmask layer and the third hardmask layer are etched in a second region. The fourth hardmask layer and the third hardmask layer are etched in a third region. The fourth hardmask layer is etched in a fourth region. The second hardmask layer and the first hardmask layer are etched in the second region and the third region. The third hardmask layer is etched in the first region and the fourth region. Via openings are formed in the underlaying dielectric layer in the second region and the third region. Trenches are formed in the underlaying dielectric layer in the first region and the fourth region. The via openings are deeper than the trenches.

In some embodiments, a first top pattern is formed over the trench pattern. The first top pattern and the trench pattern form a first composite etch mask. The fourth hardmask layer is etched in the first region and the second region using the first composite etch mask.

In some embodiments, the first top pattern is removed. A second top pattern is formed over the trench pattern. The second top pattern and the trench pattern form a second composite etch mask. The third hardmask layer is etched in the second region using the second composite etch mask.

In some embodiments, the second top pattern is removed. A third top pattern is formed over the trench pattern. The third top pattern and the trench pattern form a third composite etch mask. The fourth hardmask layer and the third hardmask layer are etched in the third region using the third composite etch mask.

In some embodiments, the third top pattern is removed. A fourth top pattern is formed over the trench pattern. The fourth top pattern and the trench pattern form a fourth composite etch mask. The fourth hardmask layer is uncovered in the fourth region using the fourth composite etch mask.

In some embodiments, an anti-spacer pattern is formed over the trench pattern. The anti-spacer pattern is etched to uncover the fourth hardmask layer in the fourth region before the fourth hardmask layer is etched in the fourth region.

In some embodiments, the fourth hardmask layer is etched in the fourth region using the anti-spacer pattern.

In some embodiments, a filler material is formed within and over the trench pattern, after the removing the second top pattern and before the forming the third top pattern.

In some embodiments, the filler material is partially etched using the second top pattern such that the trench pattern is uncovered in the third region. The trench pattern is etched in the third region to uncover the fourth hardmask layer in the third region.

In some embodiments, the filler material includes a spin-on-carbon film.

In some embodiments, the via openings are filled with protective structures before the trenches are formed. The protective structures are removed from the via openings after the trenches are formed.

In some embodiments, the second hardmask layer and the first hardmask layer are etched in the first region and the fourth region. The underlaying dielectric layer is etched in the first region and the fourth region to form the trenches.

In some embodiments, the hardmask layer stack is removed after the via openings and the trenches are formed.

In some embodiments, an opening pattern formed in the hardmask layer stack is transferred through the underlaying dielectric layer to form the via openings, and another opening pattern formed in the hardmask layer stack is partially transferred into the underlying dielectric layer to form the trenches.

In some embodiments, the via openings and the trenches are filled with metal material.

In some embodiments, the metal material has spacings equal to widths of the sidewall spacer structures.

In some embodiments, the metal material has a pitch of 22 nm or smaller, and a total edge placement error is over one fourth of the pitch of the metal material.

In some embodiments, the first hardmask material is titanium nitride, and the second hardmask material is silicon nitride.

In some embodiments, the trench pattern includes a mesa material of amorphous silicon, and the sidewall spacer structures include silicon oxide.

In some embodiments, the trench pattern has a thickness larger than individual layers of the hardmask layer stack.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIGS. 1A, 1B, 1C and 1D respectively show a vertical cross-sectional view, an angled top-down perspective view, a top-down view and an angled bottom view of a semiconductor device in accordance with some embodiments of the present disclosure.

FIGS. 3A, 3B and 3C respectively show results of self-aligned litho-etch litho-etch (SALELE) processing with different EPEs in related examples.

FIG. 4 shows a flow chart of a process of patterning for microfabrication, in accordance with one embodiment of the present disclosure.

FIGS. 6A, 7A, 8A, 9A, 10A, 11A, 12A, 13A, 14A, 15A, 16A, 17A, 18A, 19A, 20A, 21A, 22A, 23A and 24A show vertical cross-sectional views of a semiconductor device at various intermediate steps of patterning, in accordance with some embodiments of the present disclosure.

FIGS. 6B, 7B, 8B, 9B, 10B, 11B, 12B, 13B, 14B, 15B, 16B, 17B, 18B, 19B, 20B, 21B, 22B, 23B and 24B respectively show angled top-down perspective views of the semiconductor device in FIGS. 6A, 7A, 8A, 9A, 10A, 11A, 12A, 13A, 14A, 15A, 16A, 17A, 18A, 19A, 20A, 21A, 22A, 23A and 24A, in accordance with some embodiments of the present disclosure.

DETAILED DESCRIPTION

Figures 1A, 1B:
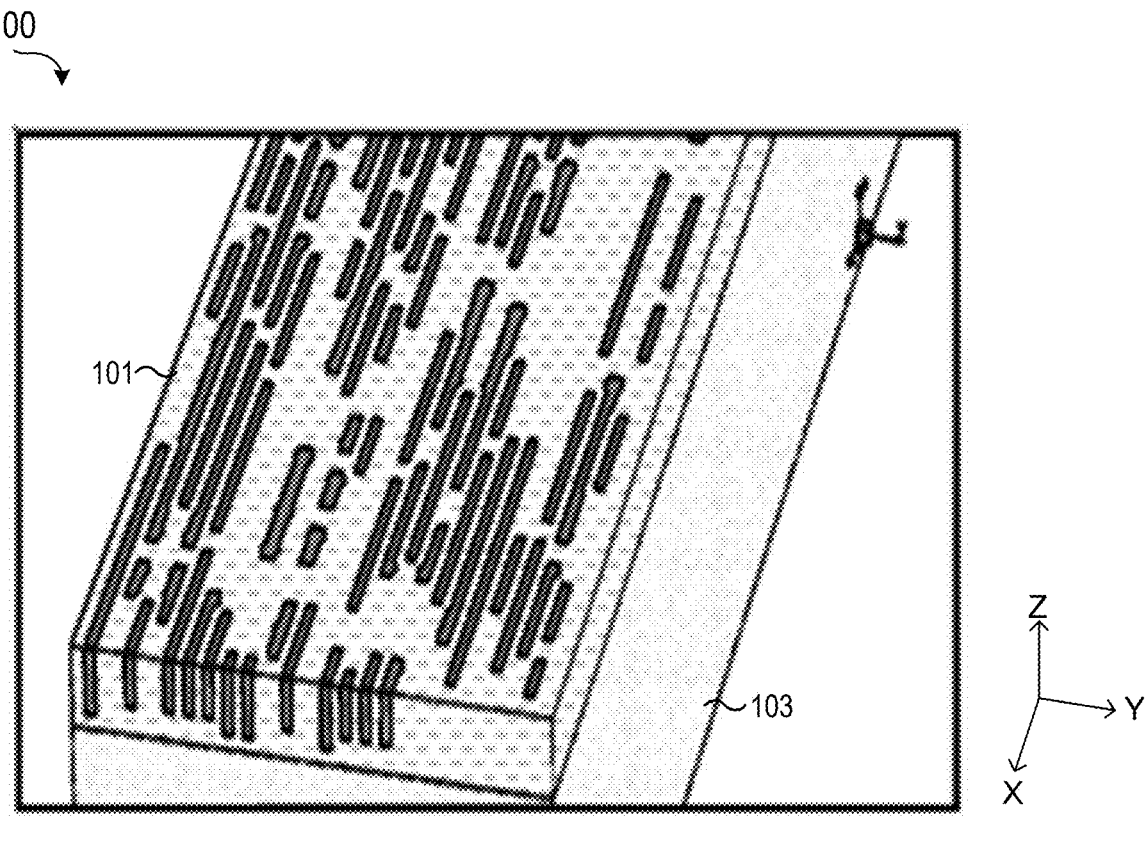

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Figure 2:
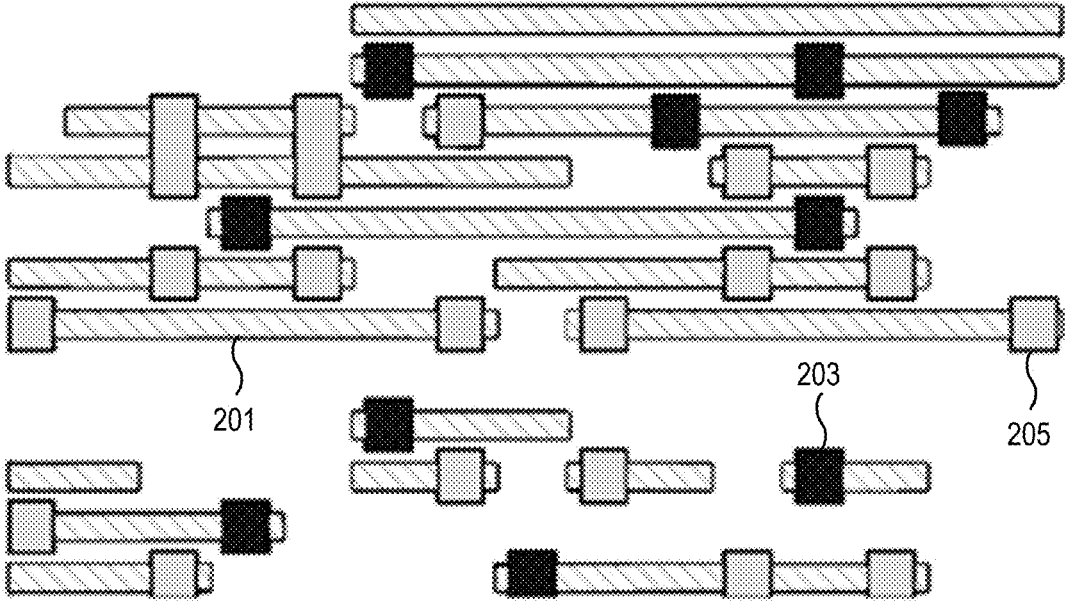
FIG. 2 shows representative decomposition of M0/VCT/VG in emulation studies.

The alignment of the via to the upper metal level in a conventional dual damascene process is provided by the fact that the hard-mask used to form the initial metal trench will provide the self-alignment of said via at least in the north-south orientation for a metal track running parallel with the active area, or east-west orientation for metal track running parallel with the transistor. The self-alignment is accomplished through sizing the via to ½ the metal track pitch as shown in FIG. 2 where angle hatch lines 201 are drawn M0 metal tracks@ 8 nm width/16 nm pitch, dark gray squares 203 are vias which will connect M0 down to local interconnect metal which will be sized to 16 nm×16 nm squares with the expectation that in the processing the north-south dimensions of the via will self-aligned to the 8 nm of the underlapping metal trench and where the east-west orientation will remain at the 16 nm intended target size, light gray vias 205 represent the vias connecting M0 tracks to the transistor as gate inputs. This method of over-sizing the via is meant to provide for the via to be fully patterned in the event that the critical dimension of the via is smaller than expected, or that the via is misaligned to the underlying metal trench by a certain amount.

The requirements for this self-alignment through dual damascene process is that the total edge placement error (EPE) of a via cannot exceed ¼ a pitch of a metal pattern. EPE is typically characterized by a combination of critical dimension uniformity (CDU) and pattern misalignment induced in the lithography process for single-exposure patterning processes, or by a combination of said lithography processes and any subsequent patterning processes which may be used in conventional spacer-assisted pitch doubling or quartering processing, or in any process in which shrinking technology is also applied to the vias, such as spacer-assisted shrinking or etch-based or even lithography track-based approaches to via shrinking. For single exposure patterning processes of very small via structures, the typical expected EPE can be as large as 5.5 nm.

This EPE becomes a challenge when exceeding the ¼ the pitch of the metal due to the fact that the edge placement of the via structure will now overlap an adjacent metal trench and will create a via to be formed in an un-intended location, thus creating an unintended short either between interconnect and metal or between gate and metal. By this characterization, an EPE capability of 5.5 nm would relegate that through conventional self-alignment strategies employed by dual damascene processing, the minimum M0 pitch would be 22 nm. Reducing the size of the via in the north-south orientation is perceived as risky as a means to eliminate the unintended via formation is adjacent metal trenches as it would then run the potential to not form any via at all in the actual intended metal trench if the critical dimensions were lower than expected and the via misaligned significantly from the underlying metal trench. In design it is typical to thus have the via sized to be ½ the pitch of the metal layer to which the via is aligning to.

Figure 3C:
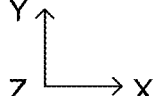

In the case of 16 nm M0 pitch using a conventional self-aligned litho-etch litho-etch integration, the impact of vias being unintentionally formed in adjacent metal tracks as a function of edge placement error is shown in FIGS. 3A, 3B and 3C based on process emulations. Black circles indicate vias which are formed for incorrect metal tracks due to cross-over from an adjacent track.

In FIGS. 3A, 3B and 3C, EPE maximum is respectively ±5.5 nm, ±4.5 nm and ±4.0 nm. As can be seen, the frequency of vias being formed in unintended metal tracks decreases with a reduction in total EPE error and eventually falls off to zero failures when the EPE reaches ¼ of the metal pitch, or in the case for 16 nm pitch M0, when the EPE decreases to below 4.0 nm. It is important to note that currently, the conventional assumption is that for random contact structures the expected maximum EPE is around 5.5 nm.

Techniques disclosed herein provide a self-aligned patterning method to pattern vias and trenches at relatively small dimensions in which placement error would be a significant concern with conventional patterning techniques. Methods herein includes a top-down self-alignment of vias to the active metal from which the vias are to connect "downward." Accordingly, a truly fully self-aligned via structure from a top-down perspective is provided where any patterned via at a given metal layer cannot cross-over to form unwanted vias in adjacent metal structures. Methods include using a hardmask layer stack of alternating layers, and stepwise transferring various composite patterns into the hardmask layer stack. A pattern formed in the hardmask layer stack can then be used to form vias and trenches in an underlying dielectric layer.

Techniques disclosed herein include methods of self-aligning via structures to metal layers through a top-down integration approach. In such techniques, some or all of the formed via structures connecting to a metal layer will self-align to the metal layer through conforming the shape of the metal to match that of the via. The self-alignment method herein is incorporated into an integration to prevent any vias or extended metal shapes to short to any adjacent metal or via structures associated with adjacent metal tracks. Incorporation of simultaneous self-alignment of all cuts and blocks for the M0 pattern along with the top-down self-alignment of via structures as well as self-alignment of adjacent or alternating metal track structures.

One embodiment realizes self-alignment through incorporation of a hybrid approach to self-aligned litho-etch litho-etch (SALELE) integration in which a first set of metal trenches are patterned in which an etch-selective sidewall spacer is deposited within said trench to provide self-alignment of adjacent features. Methods include formation of a first set of via-to-contact (VCT) and/or via-to-gate (VG) vias which will self-align naturally to the first M0 metal track due to the presence of the sidewall spacer. Formation of a second set of VCT and/or VG vias which will exist outside of the first set of M0 metal tracks and will be self-aligned away from these metal tracks by using a sidewall spacer. Formation of a second set of M0 metal tracks that are self-aligned to the second set of VCT/VG vias in which the metal will be extended to adequately encapsulate the shape of the via and the second set of VCT/VG vias as well as the second set of M0 metal tracks themselves are self-aligned to the first set of M0 metal tracks by means of the sidewall spacer. This process can be extended to also include block or cuts intended for the M0 metal tracks simultaneously to the self-alignment of the VCT/VG structures and alternating metal tracks In another embodiment, self-alignment is achieved through a process in which etch "color" (material) selectivity can be well maintained through the incorporation of partial etch transfer processes involving gap-fill or patterning type of materials. This partial transfer of the gap-fill material or patterning type materials effectively blocks etching at the bottom of open hard-mask films to maintain a fixed number of different materials present during any etch process in which selectivity can be balanced.

In another embodiment, self-alignment can include extension of processing capability from one quarter of the intended M0 pitch to three quarters of the intended M0 pitch such that for a M0 intended pitch of 16 nm, that the edge placement tolerance is extended from a minimum of 4.0 nm up to as much as 9.0 nm. This means that for a given EPE capability of 5.5 nm, conventional processes of self-alignment are no longer effective below M0 pitch of 22 nm without incorporation of this type of additional self-alignment capability herein.

In another embodiment, self-alignment can be realized across multiple processing modules where dual damascene type of applications are done. For example, M0 or the initial first metal layer in the back-end-of-line (BEOL) is chosen for demonstration purposes. The application can likewise be done at local interconnect layers in which the M0 layer will be substituted by an interconnect metal layer contacting directly to source and drain. The VCT and VG structures replaced by vias connecting the interconnects to buried or backside power or ground. This process can likewise be extended to additional BEOL metal layers as well.

In another embodiment, a hard-mask stack used for patterning purposes is set such that etch transfer processes can be used that will likewise remove finished templates memorized in upper hard-mask levels.

In another embodiment, heights of each film stack can be individually set to allow for insuring preservation of patterning templates such as side-wall spacers, fill materials, and initial memorization film stacks, while transferring structures down to lower hard-mask films, through the incorporation of height differences in addition to material selections to ensure proper etch selectivity.

In another embodiment, the vias can now be over-biased to produce a favorable lithography hardware throughput or defect performance (no missing/deformed/closed vias due to very small critical dimensions) and the top-down self-alignment for the first set of VCT/VG to the first set of M0 will self-align the size to be compliant to the first set of M0 track widths.

In another embodiment, the second set of vias can be over-biased to produce large transferred vias that will have superior conductivity over smaller vias, and will still have self-alignment to adjacent metal structures to prevent any electrical shorting or reliability failure such as time dependent dielectric break-down (TDDB).

In another embodiment, self-alignment is achieved through the selection of materials including hard-mask stacks in which etch selectivity allows for enablement of the mechanism of self-alignment.

FIGS. 1A, 1B, 1C and 1D respectively show a vertical cross-sectional view, an angled top-down perspective view, a top-down view and an angled bottom view of a semiconductor device 100 in accordance with some embodiments of the present disclosure. As shown, the semiconductor device 100 includes a substrate 103 and a dielectric layer 101 over the substrate 103. Via openings 151 and trenches 155 are disposed in the dielectric layer 101 and filled with metal material 157. As a result, the metal material 157 is disposed in a first region 141, a second region 142, a third region 413 and a fourth region 144.

In some embodiments, a first set of VCT structures (e.g. 142) are completely enclosed by a first set of M0 tracks (e.g. 141). A second set of M0 tracks (e.g. 144) as well as a second set of VCT structures (e.g. 143) are self-aligned to the first set of M0 tracks (e.g. 141) by means of the oxide spacer, which will be explained later. The second set of M0 tracks (e.g. 144) are likewise self-aligned to the second set of VCT structures (e.g. 143) where the second set of M0 tracks (e.g. 144) can expand in size wherever there is a second VCT structure (e.g. 143), but will not short to any adjacent M0 track (e.g. 141 and 144) due to the presence of the oxide spacer in the integration flow, which will be explained later. Thus, self-alignment can be achieved as long as the EPE capability of the processes are now within a minimum of ¾ M0 pitch, or for this example case, 9 nm, where any VCT or VG structure patterned will not unintentionally short to an adjacent metal track.

Additionally, it should be understood that each of the first region 141, the second region 142, the third region 143 and the fourth region 144 can include one or more sub-regions. For example, in the cross-sectional view of FIG. 1A, the first region 141, the second region 142, the third region 143 and the fourth region 144 respectively include two, one, two and six sub-regions as shown. As discussed above, the first set of M0 trenches, the first set of VCT structures, the second set of VCT structures and the second set of M0 trenches can be respectively formed in the first region 141, the second region 142, the third region 143 and the fourth region 144 and thus may respectively be referred to using numerals 141, 142, 143 and 144.

FIG. 4 shows a flow chart of a process 400 of patterning for microfabrication, in accordance with one embodiment of the present disclosure. The process 400 starts with Step S410 where a hardmask layer stack is formed over an underlaying dielectric layer. The hardmask layer stack includes a first hardmask layer, a second hardmask layer formed over the first hardmask layer, a third hardmask layer formed over the second hardmask layer, and a fourth hardmask layer formed over the third hardmask layer. The first hardmask layer and the third hardmask layer include a first hardmask material. The second hardmask layer and the fourth hardmask layer include a second hardmask material. The first hardmask material and the second hardmask material are configured to be etch-selective to each other.

At Step S420, a trench pattern is formed over the hardmask layer stack. The trench pattern includes sidewall spacer structures.

At Step S430, the fourth hardmask layer is etched in a first region.

At Step S440, the fourth hardmask layer and the third hardmask layer are etched in a second region.

At Step S450, the fourth hardmask layer and the third hardmask layer are etched in a third region.

At Step S460, the fourth hardmask layer is etched in a fourth region.

At Step S470, the second hardmask layer and the first hardmask layer are etched in the second region and the third region.

At Step S480, the third hardmask layer is etched in the first region and the fourth region.

At Step S490, via openings are formed in the underlaying dielectric layer in the second region and the third region, and trenches are formed in the underlaying dielectric layer in the first region and the fourth region. The via openings are deeper than the trenches.

An example process integration is shown in FIGS. 6A-24A and 6B-24B below.

The integration approach shown here can incorporate a self-aligned litho-etch litho-etch (SALELE) approach and it must be noted that this technique can carry over to various other integration options such as spacer-assisted multiple patterning (SAMP).

For illustrative purposes, examples used to illustrate the integration include a typical M0 metal layer pattern which will connect signal up or down to either source or drain contacts as well as provide input connections to the transistors. In a non-limiting example, an M0 pitch used in this integration approach is 16 nm. Metal tracks are assigned a width to target 8 nm and the minimum dielectric separation between the metal tracks to likewise be 8 nm. It should be understood that other dimensions (e.g. smaller or larger dimensions) are also applicable.

The choice of the M0 pitch in this example to be 16 nm is driven by the fact that it is desired to demonstrate the full top-down self-alignment of the via structures to the upper metal layer (e.g. M0 in this example) to a bottom metal layer which will be called the interconnect metal for vias connecting down to source and drain, and a bottom metal layer which will also be the gate metal for the input connection to the transistor. Based on a total edge placement error capability of 5.5 nm, any M0 pitch above 22 nm (4 times the EPE capability) will result in natural self-alignment given the minimum larger dielectric separation with the existing SALELE process. As noted previously, however, as the M0 metal pitch is reduced to a point below to 4 times the EPE tolerance, the vias intended for one set of M0 tracks can easily cross over to an adjacent metal track and cause unwanted connections in conventional techniques.

As was also stated in the previous section, the migration of M0 pitch from 22 nm down to 16 nm is planned within the next several technology nodes for random CMOS logic in order to keep area scaling viable. Activity to drive area size reduction of CMOS logic through contacted poly pitch (CPP) reduction has been effectively stalled, given the minimum required gate lengths (Lg) required to be over 11 nm for silicon channels, the width of gate spacer requiring a set minimum width for Cgd reduction, and the width of the interconnect metal to contact interface requiring a set minimum to reduce contact resistance. Significant drive to continued area scaling thus has been focused on reducing the standard cell logic heights either through elimination of the number of metal tracks required for any standard cell, stacking of the complimentary devices and transistors as what is done in CFET micro-architectures, or reduction of the lower metal pitch.

Figure 5:
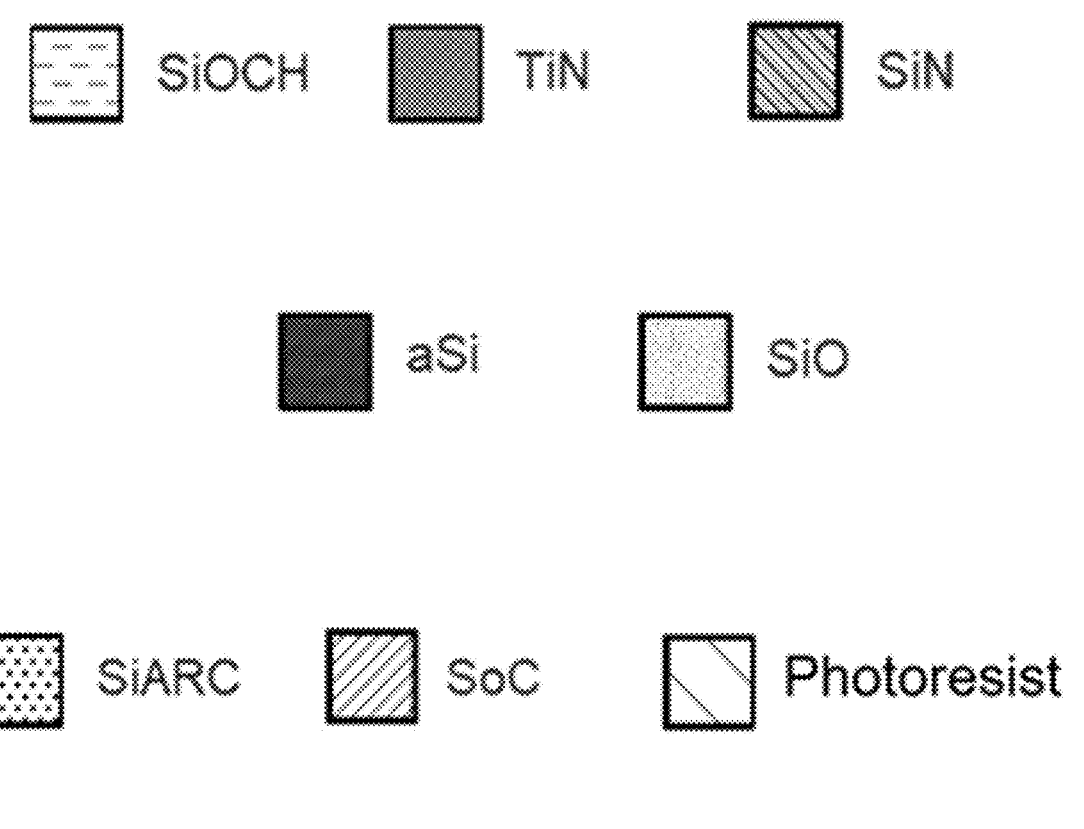
FIG. 5 shows a coding that is used to represent different materials, in accordance with some embodiments of the present disclosure.

FIGS. 6A, 7A, 8A, 9A, 10A, 11A, 12A, 13A, 14A, 15A, 16A, 17A, 18A, 19A, 20A, 21A, 22A, 23A and 24A show vertical cross-sectional views of a semiconductor device 600 at various intermediate steps of patterning, in accordance with some embodiments of the present disclosure. FIGS. 6B, 7B, 8B, 9B, 10B, 11B, 12B, 13B, 14B, 15B, 16B, 17B, 18B, 19B, 20B, 21B, 22B, 23B and 24B respectively show angled top-down perspective views of the semiconductor device 600 in FIGS. 6A, 7A, 8A, 9A, 10A, 11A, 12A, 13A, 14A, 15A, 16A, 17A, 18A, 19A, 20A, 21A, 22A, 23A and 24A, in accordance with some embodiments of the present disclosure. FIG. 5 shows a coding that is used to represent different materials in an integration flow in FIGS. 6A-24A and 6B-24B.

For illustrative purposes, an integration shown in FIGS. 6A-24A and 6B-24B is focused on M0 and subsequent VCT (via-to-contact) and VG (via-to-gate) structures. It is important to note that the VCT can etch through a low-k dielectric and stop and subsequently open some type of dielectric cap over the local interconnect metal, stop on the local interconnect metal directly, or in some circumstances, stop on the source and drain contacts directly. Once the M0 metallization is complete, a fully self-aligned via process can be implemented which will provide bottom-up self-alignment for any subsequent vias from higher metal layers to connect to the M0 metal. It is very important to stress again that this disclosure is focused on the top-down self-alignment of vias to the active metal from which they are to connect "downward" and not to restate the case of what has been termed "fully self-aligned via" in which the alignment of a via to a lower metal layer is self-aligned. What is claimed in this disclosure is a method to provide a means to truly fully self-align the via structure from a top-down perspective where any patterned via at a given metal layer cannot cross-over to form unwanted vias in adjacent metal structures.

FIGS. 6A-24A and 6B-24B will show simple cross-sections showing the basics of the integration flow along with angled top-down perspective views taken from the corresponding steps. These figures show different conditions in the M0 design. Taking processes through emulation study using actual standard cell libraries is very beneficial in identifying any unexpected problems in the process integration that may result from areas where there is significant overlap in etching steps to determine preservation amounts of memorization materials or hard spacers which are necessary in the process. Failures in emulation studies can be used to set specifications for the individual unit process steps, such as the minimum height requirement of this initial film in which the first set of M0 trenches will be transferred to.

A first representative step of this process can be the formation of a first set of metal trench structures as part of a conventional self-aligned litho-etch litho-etch (SALELE) process in which alternating sets of metal trenches in the full M0 design are first patterned prior to the formation of another set of metal trenches which will be placed adjacent to each of the metal trenches formed in the initial formation. The metal trenches can be upscaled in size by a up to two times the initial trench width of the targeted final metal width, so the trenches in this case are 24 nm trenches with a minimum pitch of 32 nm (based on final 8 nm M0 trench with at 16 nm pitch) for example.

Large tip-to-tip separation reflecting the removal of the dummy metal can be accomplished through setting the tip-to-tip distance to a desired amount. By over-biasing the first trench patterning, this will cause some merging of two metal tracks where the tip-to-tip distance is designed to be lower than 3 times the metal width. These cuts are handled through a separate cut step which will be shown in a later step in this process.

Figures 6A, 6B:
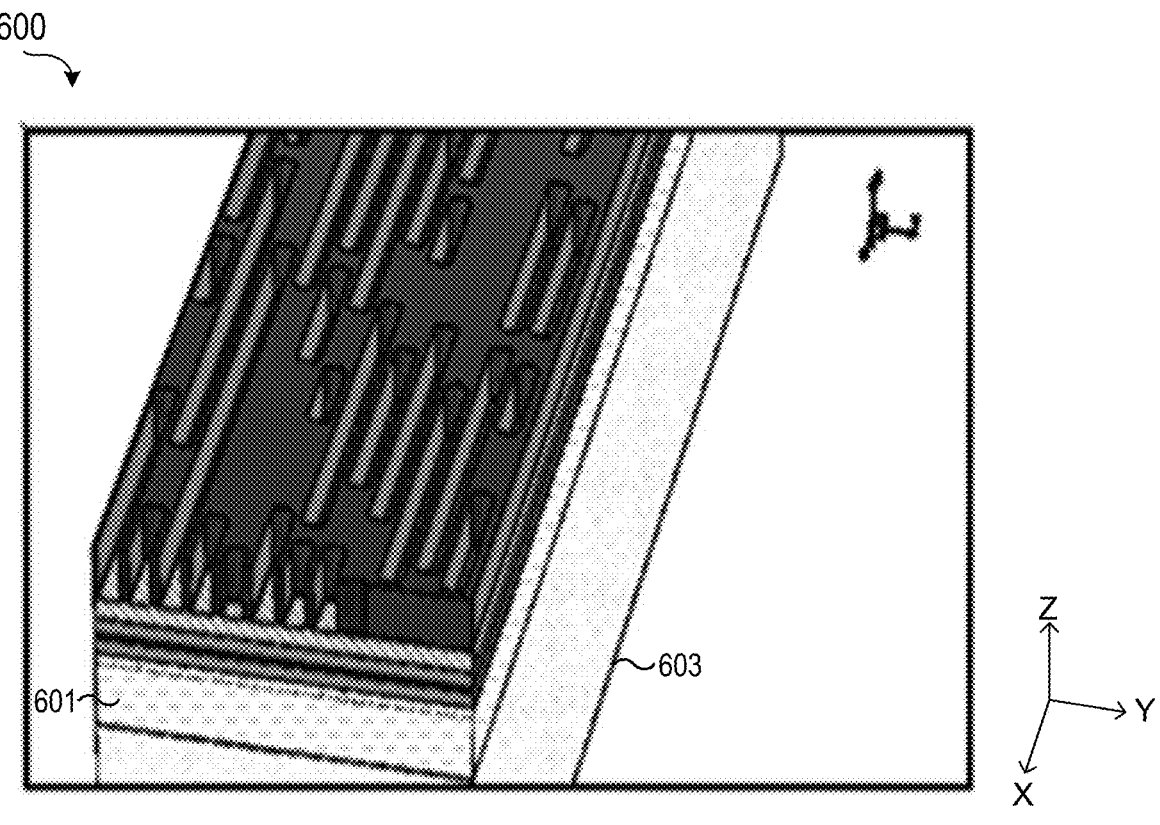

As shown in FIGS. 6A and 6B, a hardmask layer stack 610 is formed over an underlaying dielectric layer 601, which is formed over a substrate 603. The hardmask layer stack 610 includes a first hardmask layer 611, a second hardmask layer 612 formed over the first hardmask layer 611, a third hardmask layer 613 formed over the second hardmask layer 612, and a fourth hardmask layer 614 formed over the third hardmask layer 613. The first hardmask layer 611 and the third hardmask layer 613 include a first hardmask material such as titanium nitride (TiN). The second hardmask layer and the fourth hardmask layer include a second hardmask material, such as silicon nitride (SiN). The first hardmask material and the second hardmask material are configured to be etch-selective to each other. A trench pattern 620 is formed over the hardmask layer stack 610. The trench pattern 620 includes a mesa material 621 (e.g. amorphous silicon) and trench openings 623 between the mesa material 621.

In some embodiments, a first set of M0 trenches are transferred into a layer of amorphous silicon (e.g. 621) in this example, which will be formed over a hard-mask stack (e.g. 610) of materials that have good etch-selectivity to one another, which will allow for transfer etch steps to be done where upper patterning stacks can be consumed, if necessary, for the integration. In this example, the hardmask layer stack 610 includes a first/bottom/lower TiN hardmask layer (e.g. 611) which is deposited over a low-k dielectric film (e.g. 601) for which the M0 and VCT/VG structures will ultimately be transferred to prior to metallization. The first TiN hardmask layer (e.g. 611) is followed in this integration example by a first/bottom/lower SiN hardmask material (e.g. 612) which will be deposited overtop of the first TiN hardmask film (e.g. 611). A second/top/upper TiN hardmask film (e.g. 613) will be deposited overtop the bottom SiN hardmask film (e.g. 612), and a second/top/upper SiN hardmask (e.g. 614) will be subsequently deposited overtop the second TiN hardmask film (e.g. 613). The hardmask layer stack 610 can be configured to provide a bottom set of TiN/SiN hardmask films (e.g. 611 and 612) to memorize the VCT and VG structures while the M0 structures can be memorized with an upper set of TiN/SiN hardask films (e.g. 613 and 614).

A thickness of the initial amorphous silicon (e.g. 621) in which a first set of initial M0 trench patterns is transferred into is set to a thickness above that of individual TiN and SiN hardmask films (e.g. 611-614) below, which is due to the fact that amorphous silicon and TiN will in general have very similar anisotropic etch selectivity. Initial memorization of the trench and subsequent spacer process is required to be memorized within this film stack (e.g. 620 and 611-614) while transferring VG and VCT structures into the TiN/SiN hardmask stacks for both sets of M0 trenches. Thus, some of the expected self-alignment of this process can be based on topological self-alignment as well as self-alignment induced from the presence of hard spacers.

Figure 7B:
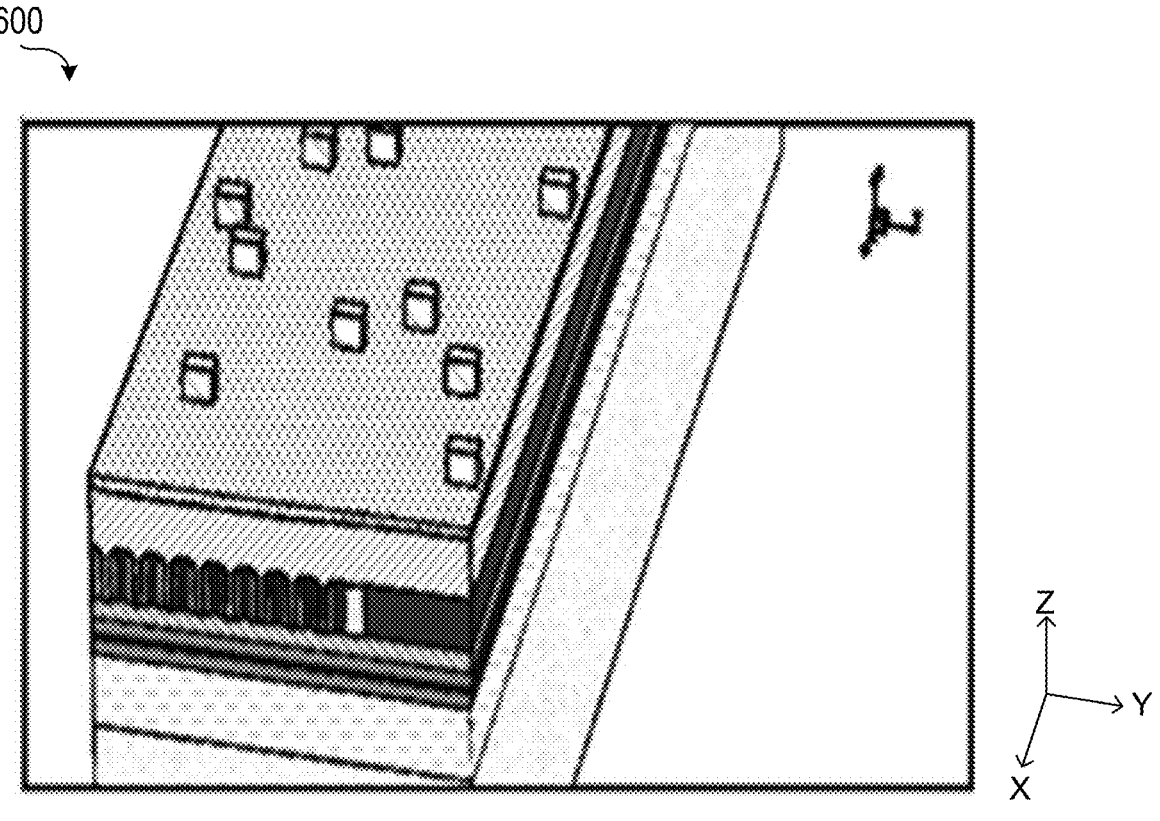
Figure 7A:
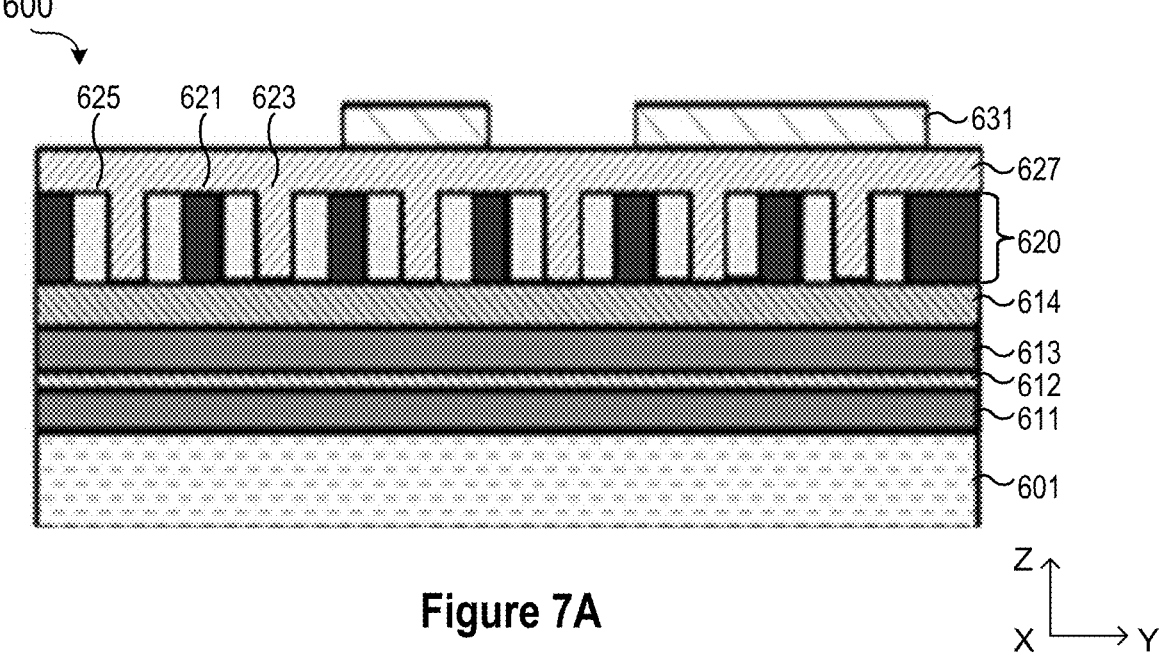

In FIGS. 7A and 7B, sidewall spacer structures 625 are formed in the trench openings 623 adjacent to the mesa material 621. A filler material 627 is then deposited to fill the trench openings 623 and optionally planarized by chemical mechanical polishing (CMP) for example. Subsequently, a first top pattern 631 is formed over the filler material 627. The first top pattern 631 and the trench pattern 620 (and the filler material 627) can form a first composite pattern. For example, the sidewall spacer structures 625 can include silicon oxide, and the filler material 627 can include a spin-on-carbon film.

In some embodiments, a spacer deposition is done, followed by a spacer open etch in order to form the sidewall spacer structures 625 only along sidewalls of a first set of metal trenches or M0 trenches (e.g. 623). The sidewall spacer structures 625 can be used to form a hard separation between the first set of metal trenches in which a second set of metal trenches or M0 trenches can be self-aligned to prevent unwanted shorting between adjacent metal lines. In conventional SALELE processes, this is observed by a noticeable distortion of the second set of metal tracks which seem to "wrap around" the first set of metal trenches where the wrap-around is dictated by the width of the spacer. The spacer will also be necessary in SALELE processes to align the first set of VCT and VG structures within the first set of metal trench structures. It is important to note that this self-alignment can only be achieved if the EPE tolerance of the patterning processes is below ¼ of the pitch of the M0 pattern, or below ½ the width of the dielectric separation between M0 tracks, whichever of the two is lower, in conventional processes or related examples.

A width of the spacer can be set to be equal to the intended dielectric separation between the metal tracks. In a non-limiting example, a width of the sidewall spacer structures 625 is 8 nm, which will leave 8 nm of the trench openings 623 still present which will become the width of the first set of metal lines.

Techniques herein likewise use the sidewall spacer structures 625 to self-align VCT and GV structures which will be aligned to a second set of M0 tracks, for which conventional SALELE processes cannot do when the M0 pitch falls below four times the EPE capability of the patterning processes, or when the M0 dielectric separation between adjacent metal tracks falls below two times the EPE capability of the patterning processes. For example, assume a 16 nm M0 pitch with 8 nm M0 actual metal width and 8 nm of dielectric separation, so at EPE capability of 5.5 nm, it would not be feasible to self-align the full set of VCT and VG structures within all M0 trenches with current SALELE integrations.

A next step is to form tip-to-tip cuts (e.g. 631) which will have dimensions below three times the metal width. Such comparatively finer cuts (e.g. 631) typically are not geared toward dummy metal removal, but for tight tip-to-tip cuts within the M0 pattern. In the integration as outlined, the minimum fine cuts (e.g. 631) are formed to be 22.5 nm, however this number (i.e. 22.5 nm) can be significantly reduced based on patterning decompositions which may be available.

In FIGS. 8A and 8B, the fourth hardmask layer 614 is etched in a first region 641 and a second region 642 using the first composite etch mask including the first top pattern 631, the filler material 627 and the trench pattern 620. The first top pattern 631 is removed, and the filler material 627 is partially removed.

In some embodiments, the aforementioned cut structures (e.g. 631) are preserved during the etch open of a gap-fill spin-on-carbon (SoC) film (e.g. 627) which has filled the first set of M0 trenches such that any "cut" regions will have an adequate amount of SoC remaining over the SiN hardmask floor (e.g. 641). The first set of M0 trench patterns can then be transferred into the SiN hardmask film (e.g. 641), while regions where M0 fine cuts will be formed will have this etch transfer blocked by the presence of SoC.

Figure 9B:
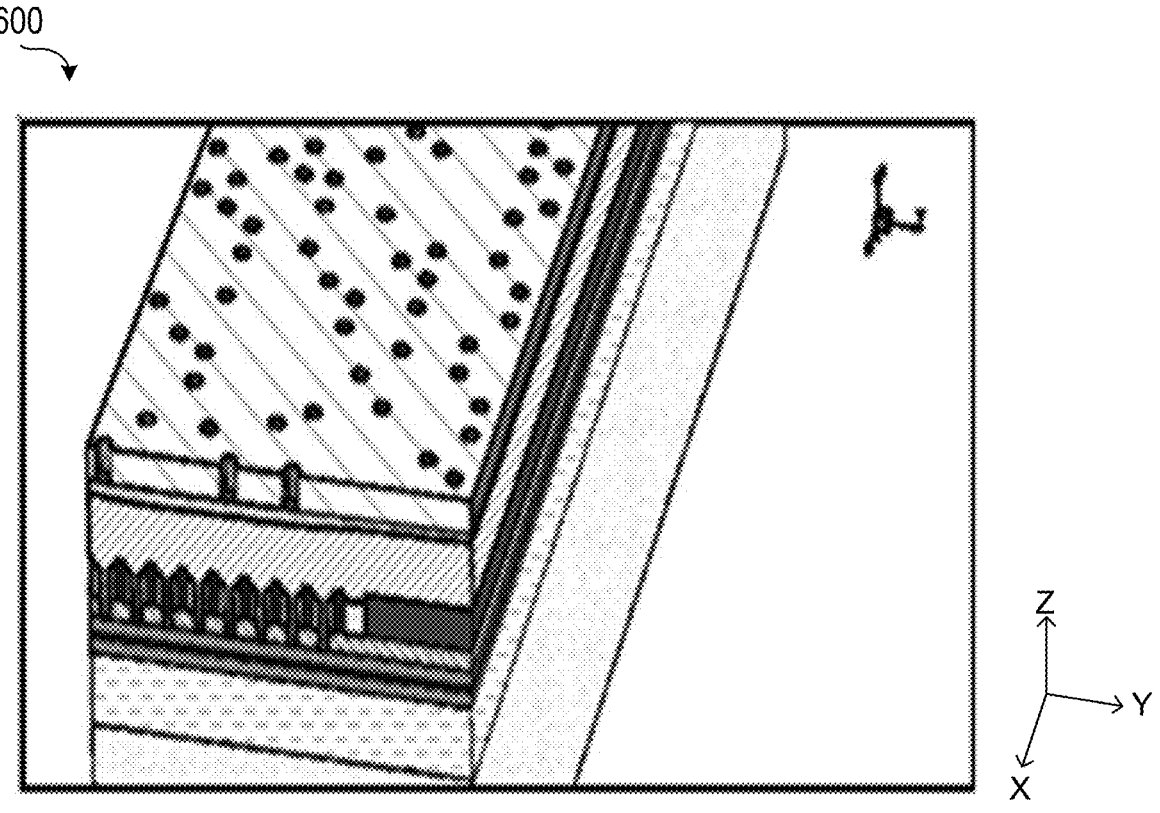
Figure 9A:
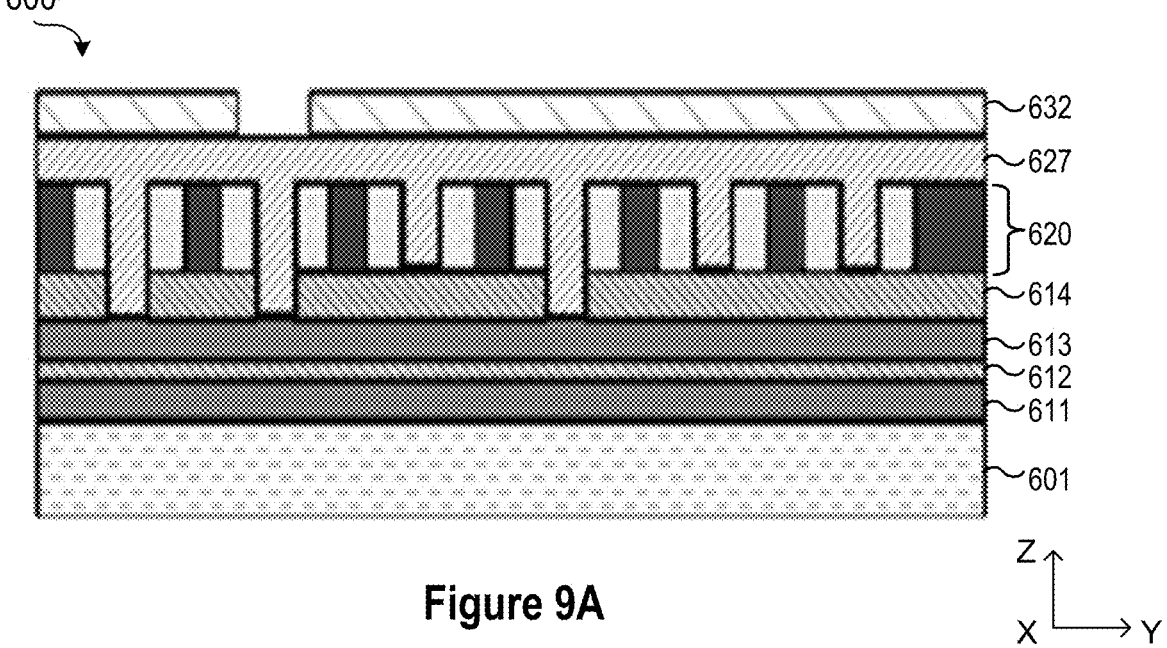

In FIGS. 9A and 9B, a second top pattern 632 is formed. The second top pattern 632 and the trench pattern 620 (and the filler material 627) can form a second composite etch mask.

In some embodiments, the SoC (e.g. 627) can be ashed with very high levels of selectivity to other materials exposed. It is important to note that etching silicon nitride selective to silicon oxide is possible, given the lower binding energies associated with silicon nitride relative to silicon oxide. Note that some erosion of the silicon oxide spacers is expected in the opening of the top SiN hardmask stack. In terms of emulation modelling, an etch selectivity of SiN: SiO=0.333 is assigned where 3 nm of silicon oxide spacer height will be consumed for every 9 nm of SiN hardmask that is opened. The erosion of the silicon oxide spacer can be compensated for through increasing the initial height of the silicon oxide spacers, which can likewise be accomplished through the increase of the starting amorphous silicon film stack used for initial M0 pattern transfer.

The integration flow herein is different from conventional SALELE integration processes at least by forming the VCT and VG structures prior to the formation of a second set of metal M0 structures. This again is driven by the desire to have both sets of VCT and VG vias to have self-alignment to the first set of M0 trenches where the VCT and VG vias aligning directly to the first set of M0 trenches will have natural self-alignment due to the presence of the hard silicon oxide spacer. A second set of VCT and VG vias will be patterned outside of the initial set of M0 trenches, but these will likewise be self-aligned to the initial M0 trench structures by a combination of both the hard silicon oxide spacer as well as incorporation of a gap-fill and partial recess which will fill into the initial M0 trench structures which will provide further self-alignment where the second set of VCT and VG structures cannot cross over to the first set of M0 trench structures.

Herein, a first set of VCT vias are being patterned which will self-align to the first set of M0 trenches. Because some form of self-alignment is provided with this process, the via structures can be over-sized in order to obtain improved pattern fidelity without the need to do any post-processing of the via to shrink its size which often require additional processing steps, wafer costs, and potential for yield-loss and greater process variability.

Figure 10B:
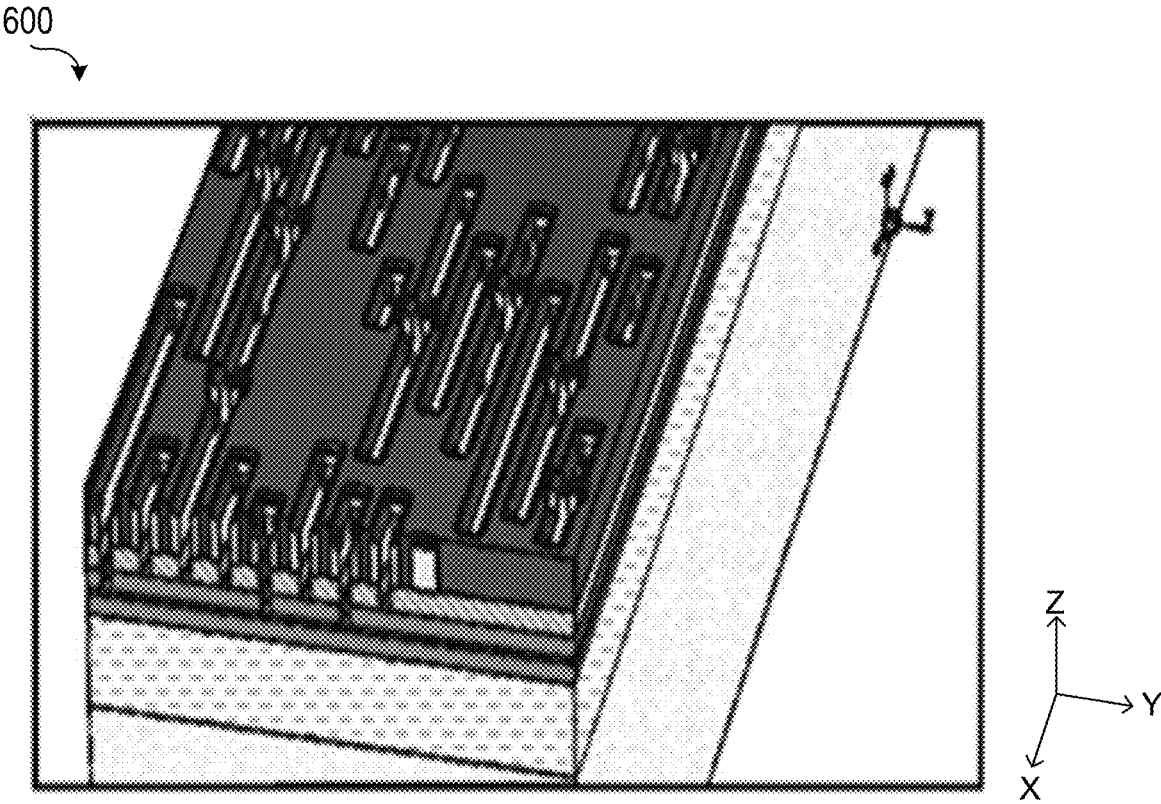
Figure 10A:
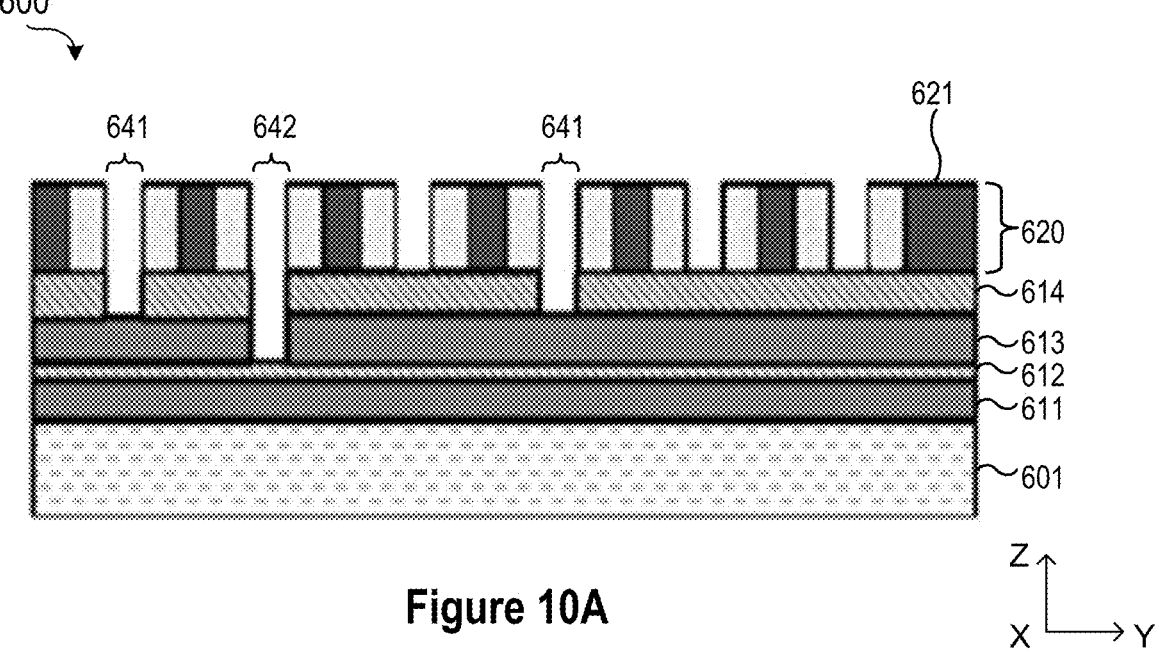

In FIGS. 10A and 10B, the third hardmask layer 613 is etched in the second region 642 using the second composite etch mask including the second top pattern 632, the filler material 627 and the trench pattern 620. Then, the second top pattern 632 and the filler material 627 are removed.

In some embodiments, VCT structures (e.g. 642) will be used to open the gap-fill SoC material (e.g. 627), and the presence of the silicon oxide spacers (e.g. 625) as well as the amorphous silicon (e.g. 621) will provide a means where the edge placement error of the VCT pattern can be off as much as ¾ the M0 pitch without extending to an undesired metal trench, which is well above the assumed current EPE capability for random contact features in currently available advanced EUV lithography of 5.5 nm. The VCT structures (e.g. 642) can even be increased in size in order to have a width of a full M0 pitch which will reduce the EPE tolerance to ½ the M0 pitch which is still beyond the EPE limitations of current EUV capability, so even with oversizing the VCT patterns at lithography will still provide amble space to allow for self-alignment of the VCT structures.

For example, the VCT structures (e.g. 642) can be etched through the SoC gap-fill (e.g. 627) and extend down past the opened top SiN hardmask film stack (e.g. 614) opened in the initial M0 trench memorization process and proceed down to the second TiN hardmask film (e.g. 613).

In this example, the second TiN hardmask (e.g. 613) is opened only in the VCT intent region (e.g. 642), where the first set of M0 structures (e.g. 641) are still memorized in the top SiN hardmask film (e.g. 614). It is likewise important to state here that we assign an etch selectivity of TiN:SiO=0.10 where 1 nm of SiO spacer will be consumed for every 10 nm of TiN hardmask, and an etch selectivity of TiN:aSi=1.00, where amorphous silicon will etch equally with the top TiN hardmask. As there will be cases where it is desired to over-expose the size of the VCT structure, there can potentially be amorphous silicon exposed during the top TiN hardmask etch process. In this case, the height of the starting amorphous silicon film is set to an adequate thickness in order to still be preserved during the top TiN hardmask etch process.

In our example integration, a second TiN hardmask (e.g. 613) thickness of 15 nm is selected, and an amorphous silicon (e.g. 621) thickness of over 50 nm in order to account of erosion of the amorphous silicon film during this etch process.

It must be noted here that self-alignment in such applications is very dependent on available combinations of materials which will have etch selectivity to one another while still maintaining a number of other processing constraints. In particular for back-end-of-the-line (BEOL) applications, there are a number of thermal processing considerations which also limit the number of etch selective materials which may be available. In these cases, we can still derive some level of self-alignment through the adoption of height differences between different materials in the integration stack.

The spin-on-carbon film (e.g. 627) can then be ashed with very high selectivity with respect to the other materials exposed in the device. As shown, the presence of the VCT (e.g. 642) aligned to the first set of M0 trenches (e.g. 641) can be seen transferred into the top TiN hardmask film (e.g. 613) while the first set of M0 trenches (e.g. 641) themselves have only been transferred into the top SiN hardmask film (e.g. 614). The silicon oxide hard spacers (e.g. 625) are still present and will allow for the second VCT and VG structures which will be specific to the alternating sets of M0 trenches not yet patterned will be formed.

FIGS. 8A-10A show one embodiment where the fourth hardmask layer 614 is etched simultaneously in the first region 641 and the second region 642 using the first composite etch mask while the third hardmask layer 613 is etched separately using the second composite etch mask. In an alternative embodiment (not shown), the fourth hardmask layer 614 can be etched in the first region 641 using the first composite etch mask before being etched in the second region 642 using the second composite etch mask. Then, the third hardmask layer 613 can be etched using the second composite etch mask.

Figure 11B:
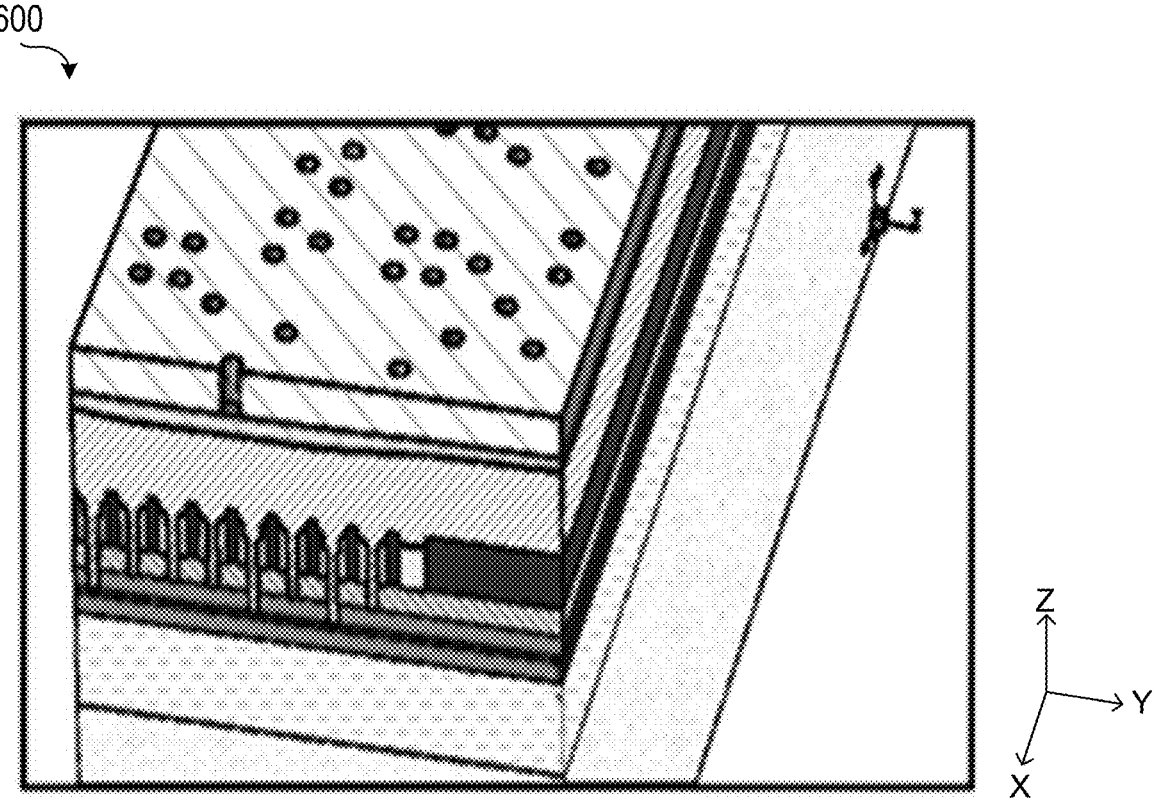
Figure 11A:
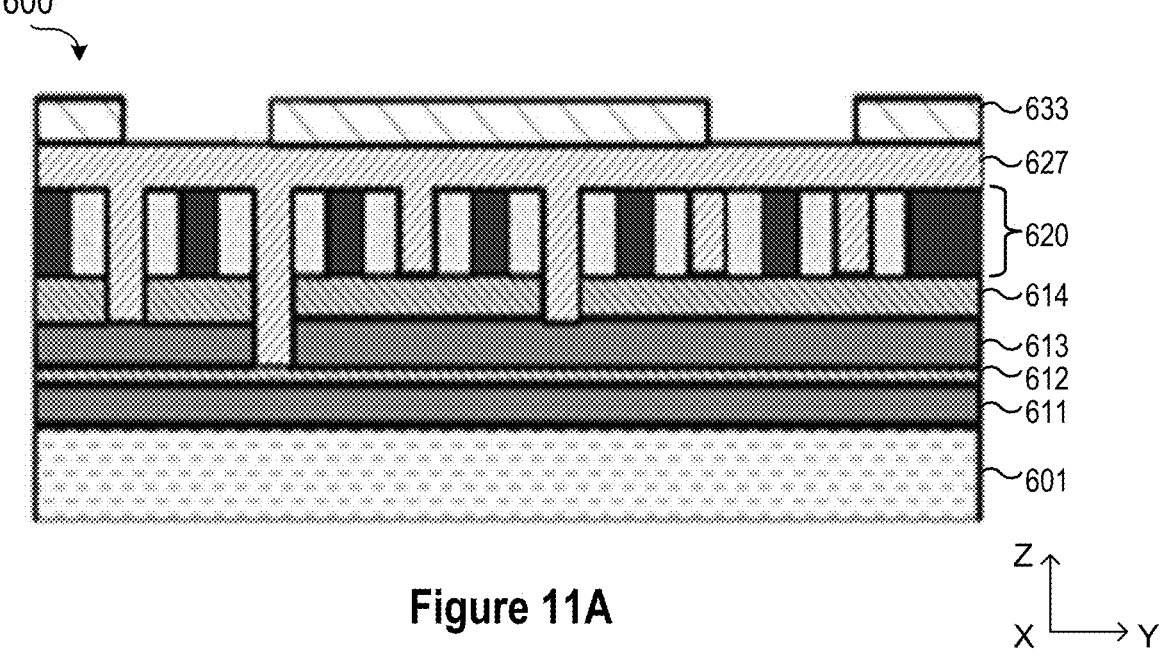

In FIGS. 11A and 11B, the filler material 627 is formed and optionally planarized before a third top pattern 633 is formed. The third top pattern 633 and the trench pattern 620 (and the filler material 627) can form a third composite etch mask.

In some embodiments, a second set of VCT structures can then be patterned with the intention of being self-aligned to the alternating M0 trenches which have not yet been patterned themselves or memorized into any hardmask. The reason why the second set of VCT structures will be patterned before the second set of M0 trenches is so that one can continue to access the self-alignment capability of having a three "color" combination of materials which will have very good etch selectivity across one another. This example includes the amorphous silicon (e.g. 621), the hard silicon oxide spacer (e.g. 625), and the SoC gap-fill (e.g. 627) as the three "color" solution where the second set of VCT structures will open the amorphous silicon selective to the silicon oxide and SoC gap-fill material.

Because this process provides some form of self-alignment, one can over-size the via structures in order to obtain improved pattern fidelity without the need to do any post-processing of the via to shrink its size which often require additional processing steps, wafer costs, and potential for yield-loss and greater process variability.

Figure 12B:
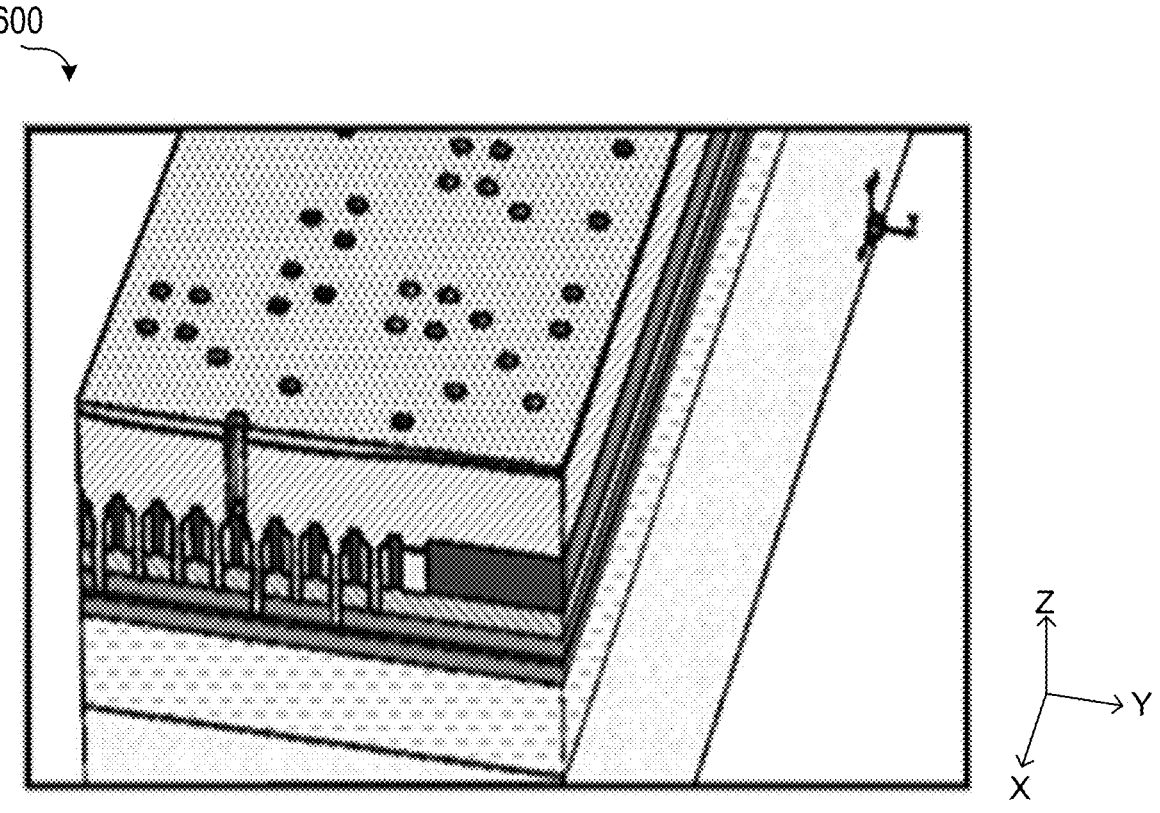
Figure 12A:
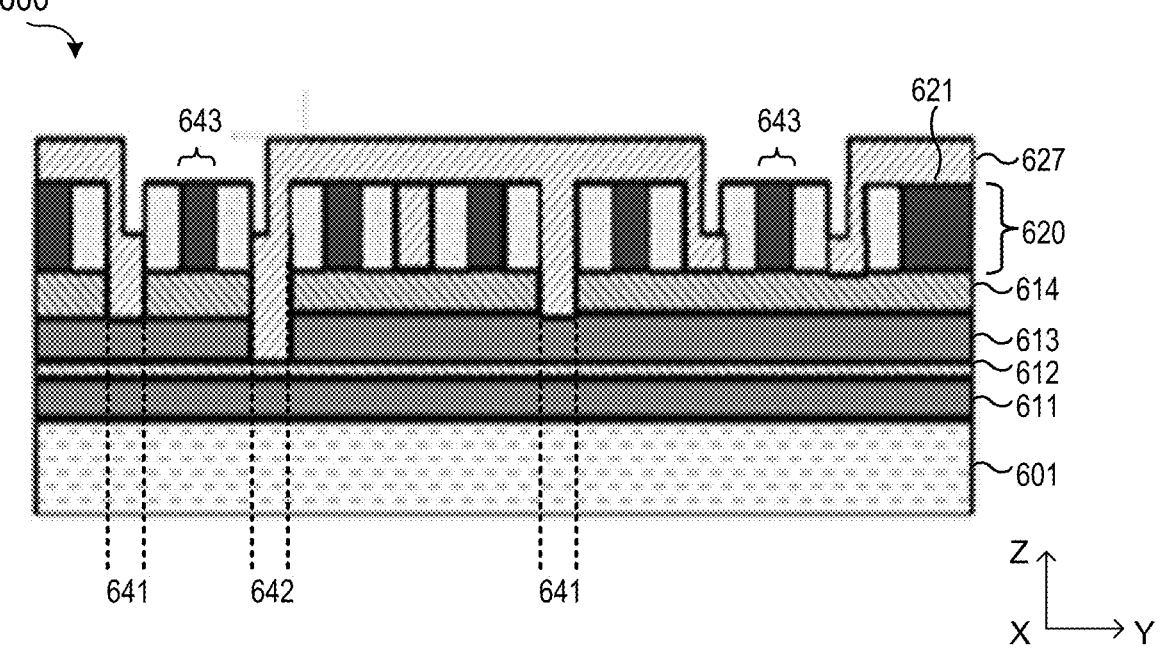

In FIGS. 12A and 12B, the filler material 627 is partially etched using the third top pattern 633, and the third top pattern 633 is removed.

In some embodiments, an enabling step in this type of integration is to partially open the SoC film (e.g. 627) such that the amorphous silicon (e.g. 621) can be revealed or exposed, while the first-pass VCT (e.g. 642) and M0 structures (e.g. 641) are still filled such that the bottom TiN hard-mask film (e.g. 611) is not exposed to the subsequent processing step in which we will etch the amorphous silicon (e.g. 621) using an anisotropic etch process to transfer the second set of VCT structures into.

Again, this partial transfer of the SoC gap-fill film (e.g. 627) is what will maintain our three-color etch selectivity where one will be able to keep very good etch selectivity while one does the etch transfer of the second set of VCT structures through the amorphous silicon film. The SoC etch can have an endpoint detection set to amorphous silicon (e.g. 621) and then a set over-etch time can be set to ensure that all of the regions of amorphous silicon (e.g. 621) are adequately exposed in which the VCT transfer is to be done. In this manner, the process variability of such an integration can be improved through setting the initial height of the amorphous silicon film (e.g. 621) to a height which will allow for some variability of the partial SoC recess (e.g. 627) etch to ensure that both final processing conditions are met.

The SoC gap-fill etch (e.g. 627) can be well-controlled and reveal the surface of the amorphous silicon (e.g. 621) for which the VCT structures will be etched, while ensuring that a minimal amount of gap-fill is still present within the opened M0 trenches where the floor will be exposed TiN or some other hard-mask material which will in general have similar etch selectivity to amorphous silicon.

Figure 13B:
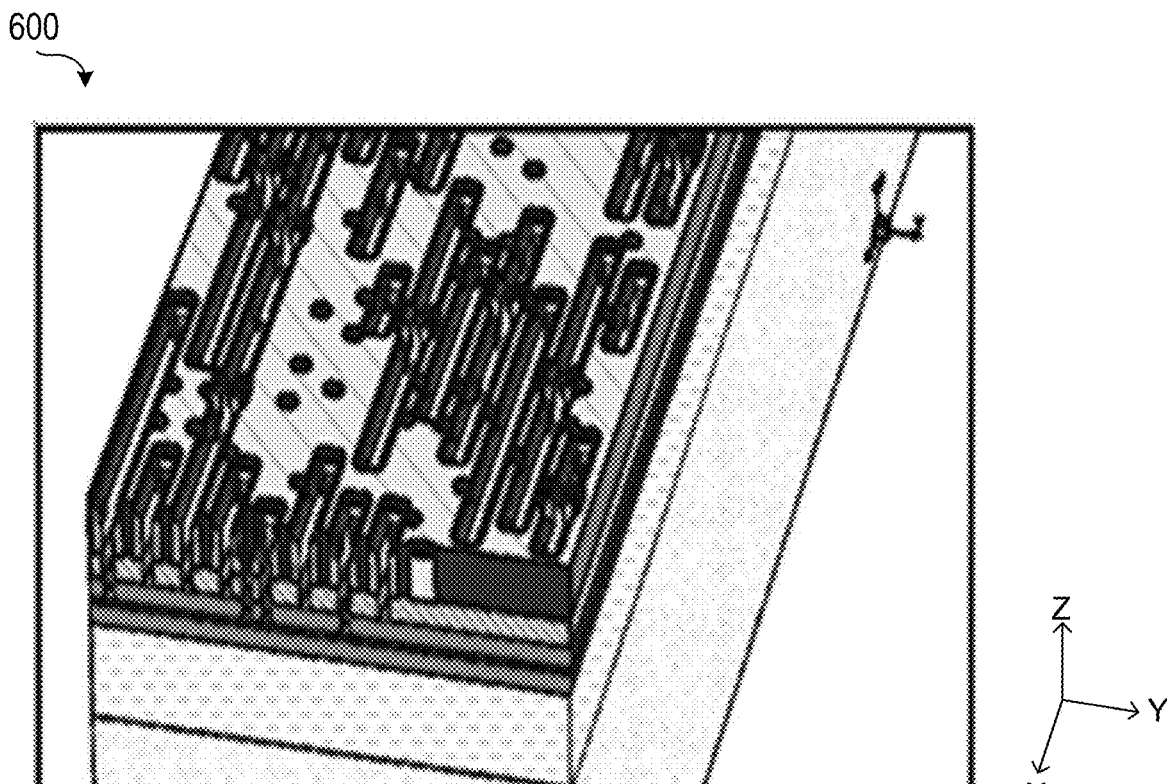
Figure 13A:
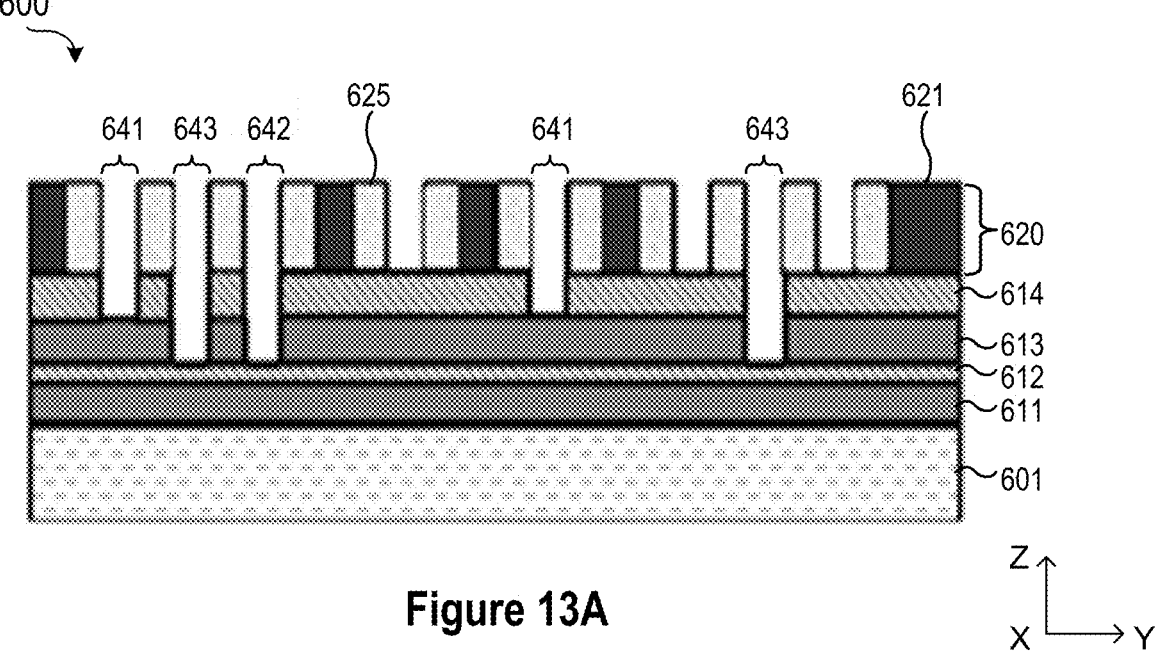

In FIGS. 13A and 13B, the mesa material 621, the fourth hardmask layer 614 and the third hardmask layer 613 in the third region 643 are etched. The filler material 627 is removed.

In some embodiments, a second set of VCT structures (e.g. 643) can first be transferred through the amorphous silicon (e.g. 621) while the first set of VCT structures (e.g. 642) are still memorized in the upper TiN/SiN hard-mask films (e.g. 614 and 613) and protected by the remaining gap-fill materials (e.g. 627).

It is to be expected that the silicon oxide spacer (e.g. 625) will have some degree of non-selectivity to the amorphous silicon etch (for the emulation modelling we have assumed aSi:SiO=10.0 where we can etch 10 nm of amorphous silicon while consuming only 1.0 nm of silicon oxide in the anisotropic etch process). The oxide spacer (e.g. 625) will go through some degree of erosion, particularly in the regions where there are multiple overlaps of both first-pass and second-pass VCT structures where some spacers may encounter twice the VCT etch transfer processing. Again, the height of the initial amorphous silicon film can be set to a height which will ensure that adequate residual silicon oxide spacer height is maintained to be used for the final self-alignment which will be necessary for the transfer of the second set of M0 trenches into the hard-mask stack.

After the second set of VCT structures (e.g. 643) have been transferred into the top SiN hardmask film (e.g. 614), the etch can be switched over to then continue this etch process into the top TiN hardmask film (e.g. 613). The etch selectivity between the silicon nitride and the silicon oxide spacer will have a greater impact as the selectivity is typically on the order of SiN:SiO=3.0 but can be as low as 2.0. As such, the height of the top silicon nitride hard-mask film (e.g. 614) can be reduced relative to the top TiN hardmask film (e.g. 613), or we can establish a proper height of the initial amorphous silicon film, which will likewise lead to a taller silicon oxide spacer height.

The SoC partial transfer etch can likewise lead to partial gap-fill within the regions where one does not want to unintentionally open the regions of the first M0 pattern which one wants to remain blocked, meaning that the amorphous silicon (e.g. 621) may have been etched but not transferred to the top silicon nitride hardmask film (e.g. 614). After the VCT structure has been transferred to the top silicon nitride hard-mask film, the etch can transition again to etch the second TiN hard-mask film so that the VCT structures from both patterning passes are aligned with one another to a common hard-mask layer.

The SoC gap-fill material (e.g. 627) can then be ashed away to reveal the current pattern which consists of VCT structures which have been transferred down though the top silicon nitride hard-mask and second TiN hard-mask film stacks (e.g. 614 and 613), and the first set of M0 structures (e.g. 641) which have been etched down only through the top silicon nitride hard-mask stack (e.g. 614).

The first set of VCT structures (e.g. 642) are completely self-aligned to the first set of M0 trenches (e.g. 641), while the second set of VCT structures (e.g. 643) are patterned freely, but still maintain self-alignment to the first set of M0 trenches (e.g. 641) due to the presence of the hard silicon oxide spacer (e.g. 625).

Figure 14B:
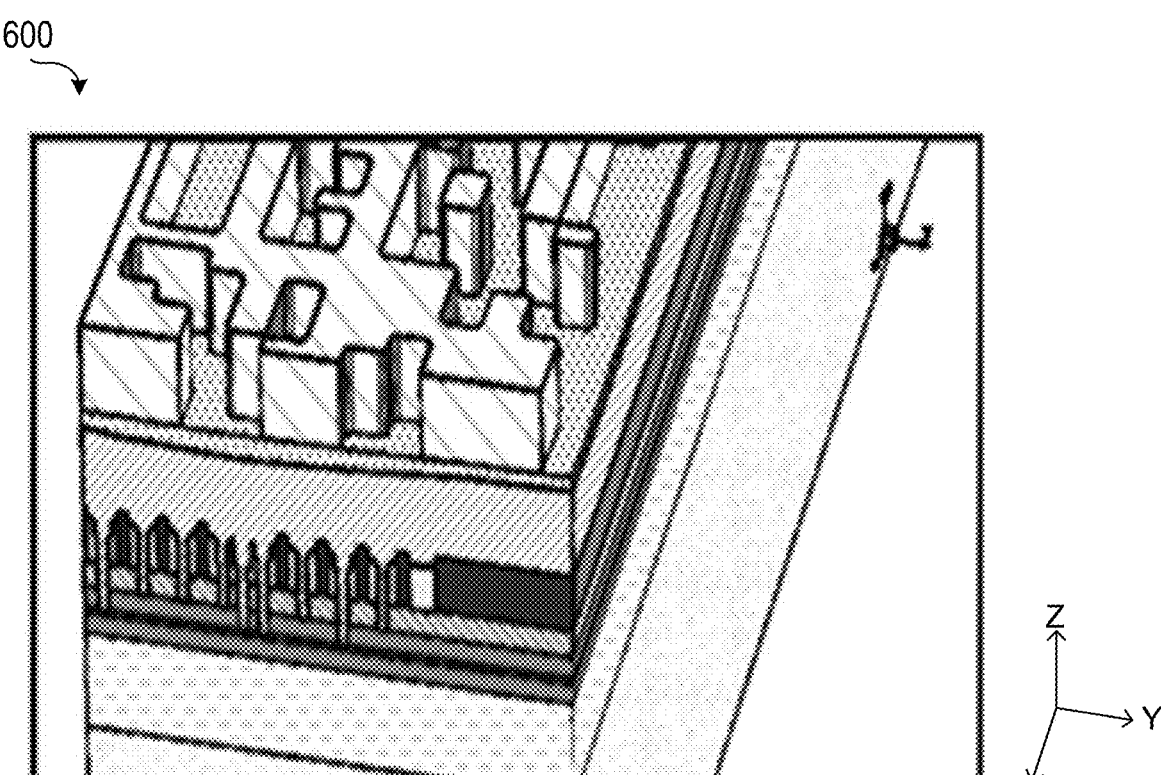
Figure 14A:
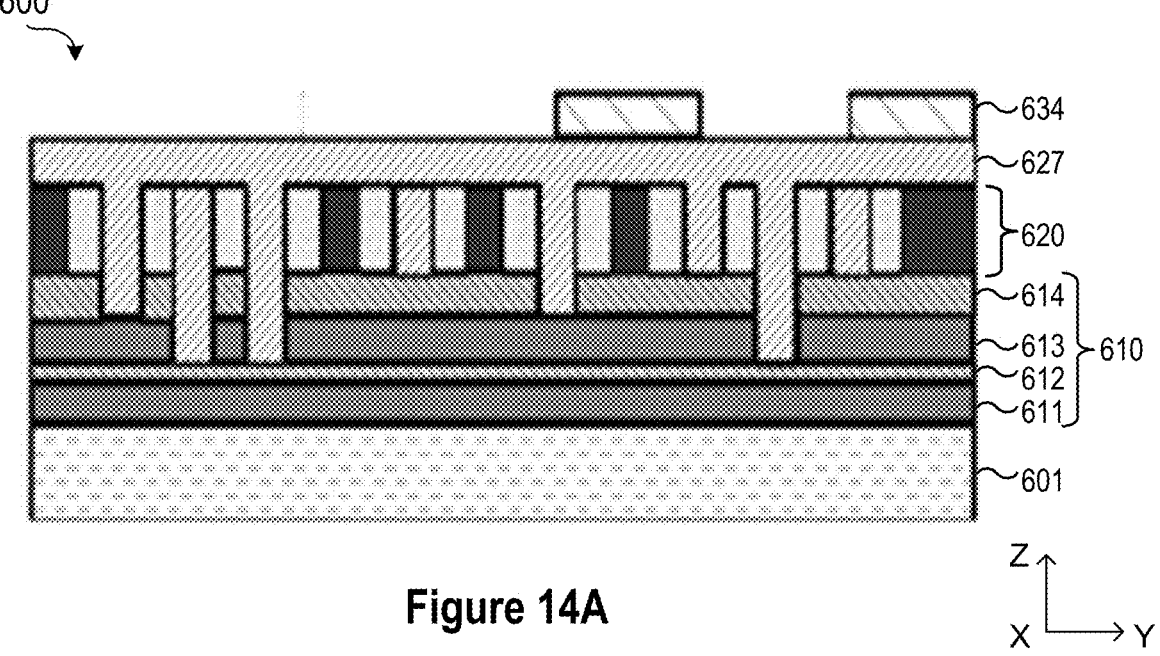

In FIGS. 14A and 14B, the filler material 627 is formed and optionally planarized before a fourth top pattern 634 is formed. The fourth top pattern 634 and the trench pattern 620 (and the filler material 627) can form a fourth composite etch mask.

In some embodiment, a second set of M0 trenches have multiple options for patterning. Processing can continue with a SALELE type of decomposition and pattern the trenches with very wide dimensions where the coarse intended dummy metal removal is patterned through tip-to-tip dimensions of the individual trenches. The fine "cuts" are patterned into the second set of M0 pattern through a separate patterning step incorporated into the integration.

Another approach shown here is to highlight the application of a process to incorporate fine trench patterning using a chemical anti-spacer approach which is shown below. In this integration method, the second set of M0 trenches (e.g. 644) can be done as a continuous trench structure in which the coarse and fine "cuts" are accomplished through a single or multiple exposure process.

The example approach combines both coarse and fine "cuts" to a single EUV decomposition. In this integration approach, however, the "cuts" may need to be memorizes before the small trench structures are patterned which will be the second set of M0 trenches.

In this "cut" approach, the amorphous silicon can be preserved where either a coarse or fine "cut" in the second set of M0 trenches can be retained, and the remaining amorphous silicon (e.g. 621) can be opened in order to allow for the second set of M0 patterned trenches to be transferred down to the underlying hard-mask stack (e.g. 610).

Figure 15B:
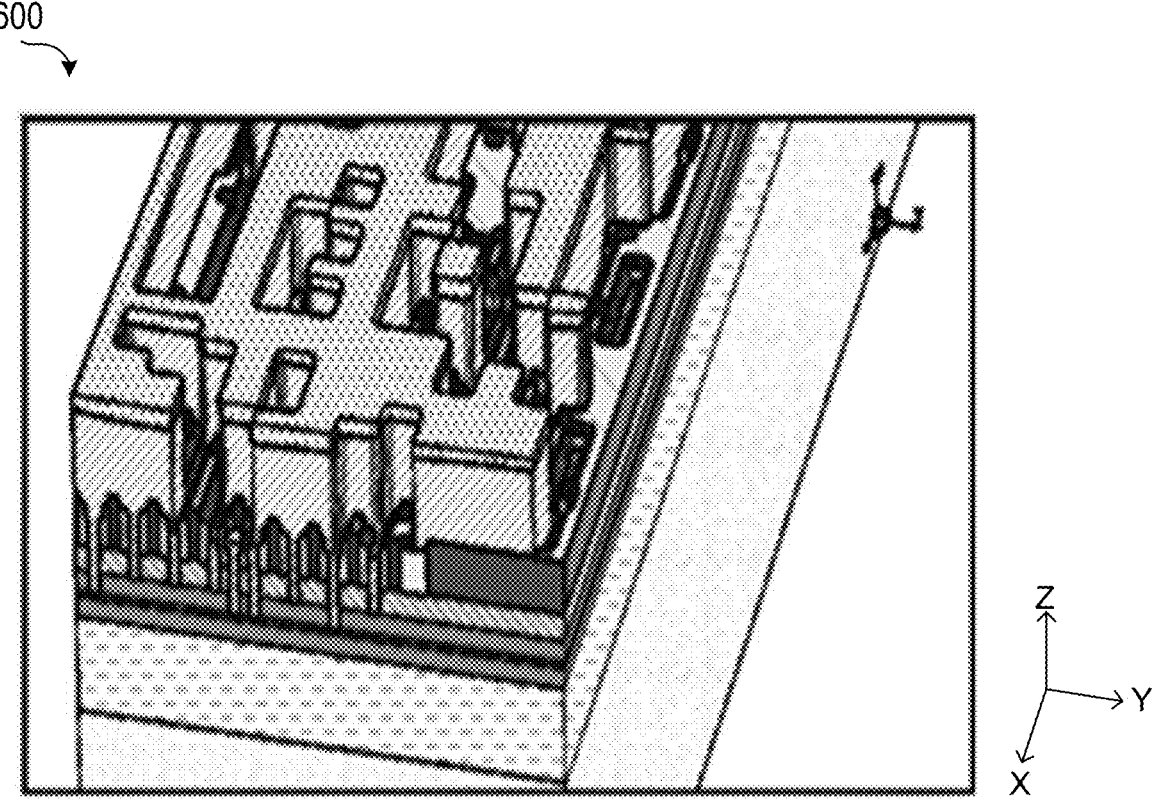
Figure 15A:
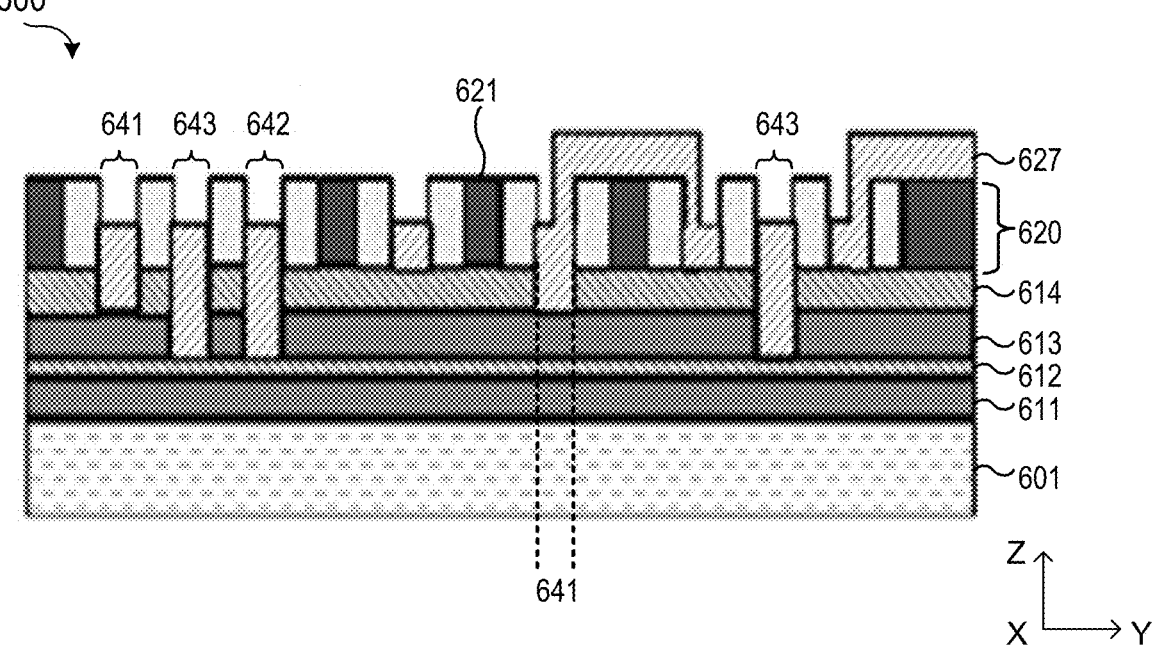

In FIGS. 15A and 15B, the filler material 627 is partially etched, and the fourth top pattern 634 is removed.

In some embodiments, this process integration also requires partial transfer of the SoC gap-fill material (e.g. 627) which will reveal the amorphous silicon (e.g. 621) in the intended "non-cut" second set of M0 trenches, while preserving some gap-fill material (e.g. 627) in the VCT (e.g. 642 and 643) and first set of M0 trenches (e.g. 641) which have been transferred down into the top silicon nitride hard-mask film, leaving a floor material of TiN hard-mask (e.g. 614) which will have equal etch selectivity to the amorphous silicon (e.g. 621) which is being etched.

Figure 16B:
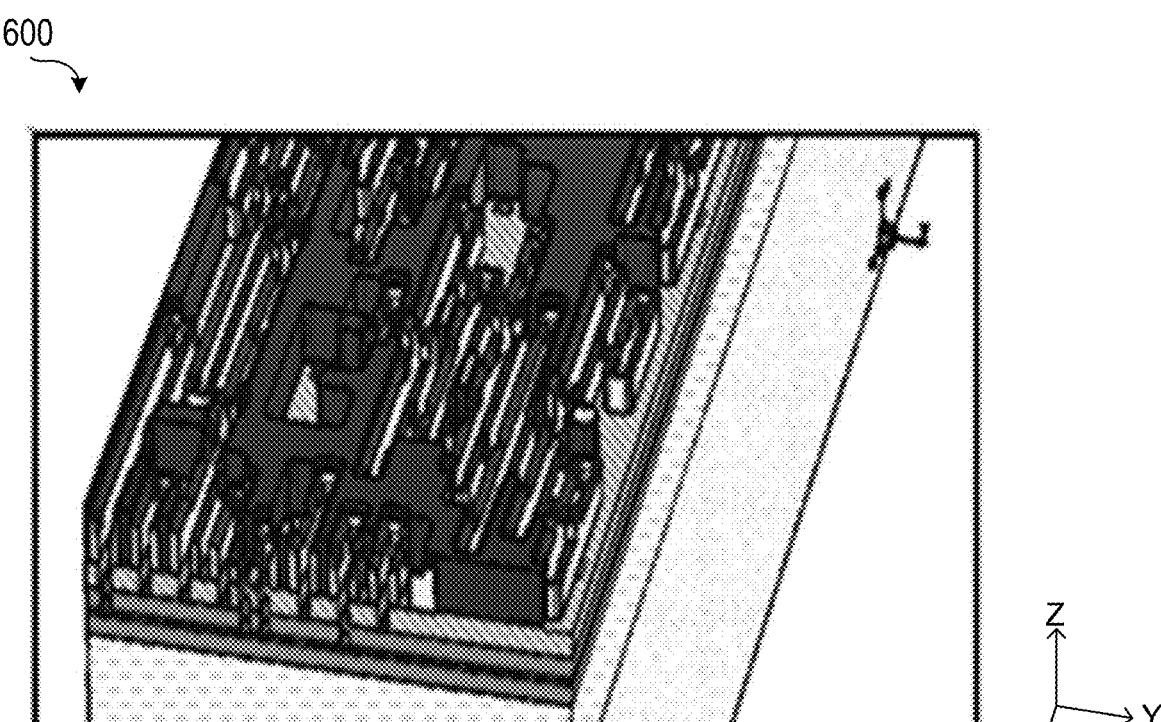
Figure 16A:
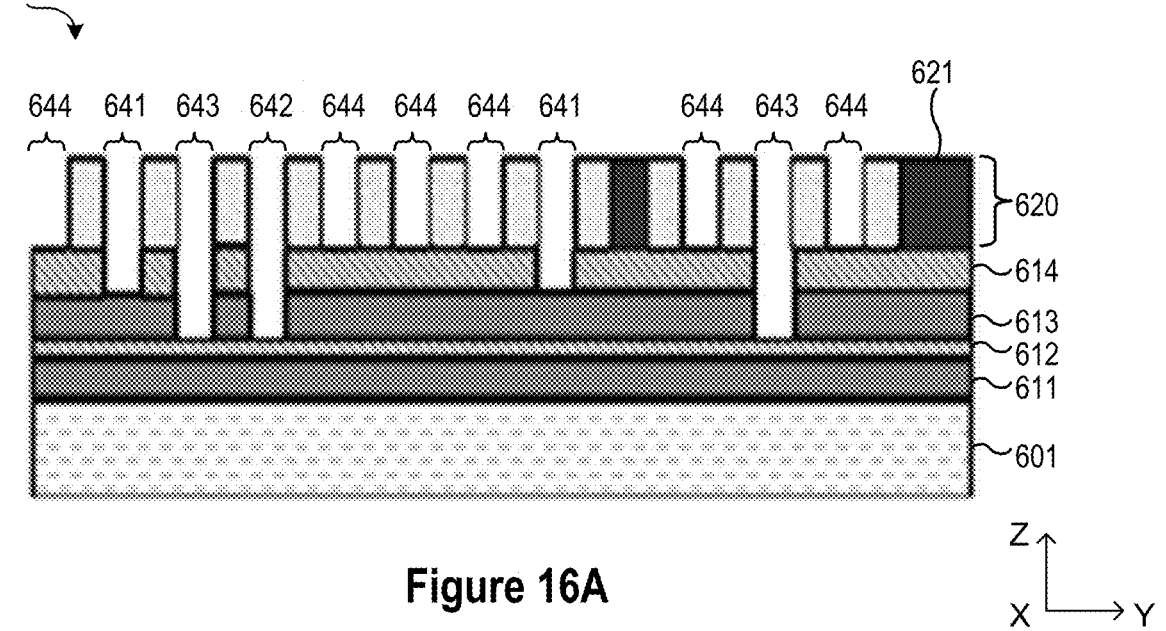

In FIGS. 16A and 16B, the mesa material 621 is removed in a fourth region 644, and the filler material 627 is removed.

In some embodiments, after the amorphous silicon (e.g. 621) in the "non-cut" region is revealed by the partial etch transfer of the SoC gap-fill (e.g. 627), an anisotropic etch process can be used to register a second set of M0 trenches (e.g. 644). The remaining amorphous silicon (e.g. 621) preserved in the film stack will participate in preventing the transfer of the second set of M0 trenches in the cut regions by blocking the transfer of these trenches into the top TiN hard-mask film (e.g. 613) later in the process.

It is necessary to state that in this particular integration, the cut pattern needs to be done ahead of the second set of M0 trench patterning based on how patterning the second set of M0 trenches (e.g. 644) is intended. In alternate integration approaches we do not.

The SoC gap-fill (e.g. 627) can be ashed away to reveal the current progress where both sets of VCT structures (e.g. 642 and 643) have been transferred into the top silicon nitride hard-mask and TiN hard-mask films (e.g. 614 and 613), the first set of M0 trenches (e.g. 641) have been memorized only into the top silicon nitride hard-mask film (e.g. 614), and the cuts intended for the second set of M0 trenches (e.g. 644) have been memorized through the retention of the amorphous silicon film (e.g. 621).

Figures 17A, 17B:
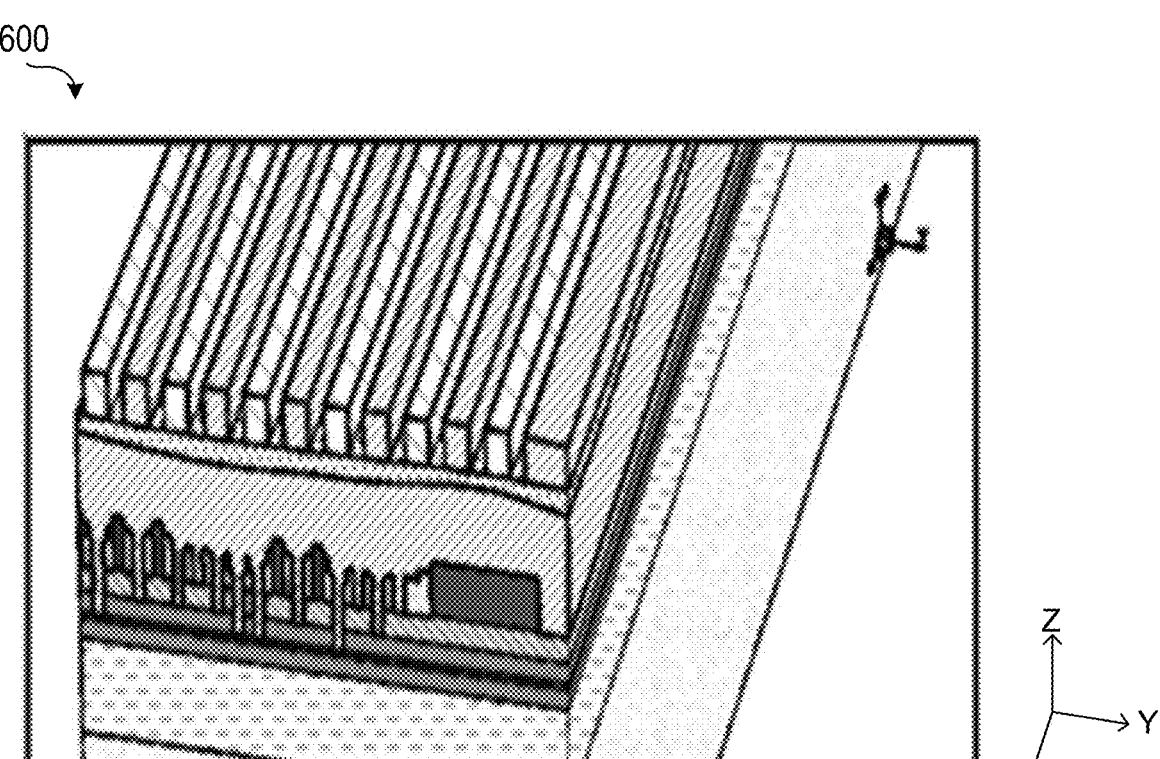

In FIGS. 17A and 17B, the filler material 627 is formed and optionally planarized. An anti-spacer pattern 635 is formed over the filler material 627 and the trench pattern 620. The anti-spacer pattern 635 can include alternating lines of the filler material 627 and a mandrel material 629.

In this example, the second M0 trench formation can be done through a chemical-based anti-spacer approach in which a resist-based mandrel (e.g. 629) is utilized to pitch-double trenches after the coating an acid-liable film overtop the resist mandrel pattern.

It is very important to state that in alternate integrations, one can simply pattern this process similarly to that of the first set of M0 trenches with the exception that one may not pattern these trenches to the same extreme in critical dimension width as one might still need to self-align these trenches to the first set of trenches.

Upon formation of the pitch doubled trenches through the chemical anti-spacer process, one can pattern very fine trenches with very good defect control and critical dimensional uniformity. The size of the final trench can be sized through reducing the sizing of the starting resist mandrel and increasing the diffusion amount of acid groups within the second acid-liable covering film. The size of the second trench should indeed be biased upward so that a larger trench is patterned over the targeted 8 nm size of the intended metal trench. This is to account for EPE issues where the mandrel is mis-aligned to the first set of M0 trenches that we will still adequately pattern a large enough second set of trench structures that will meet the minimal width requirements.

Figure 18B:
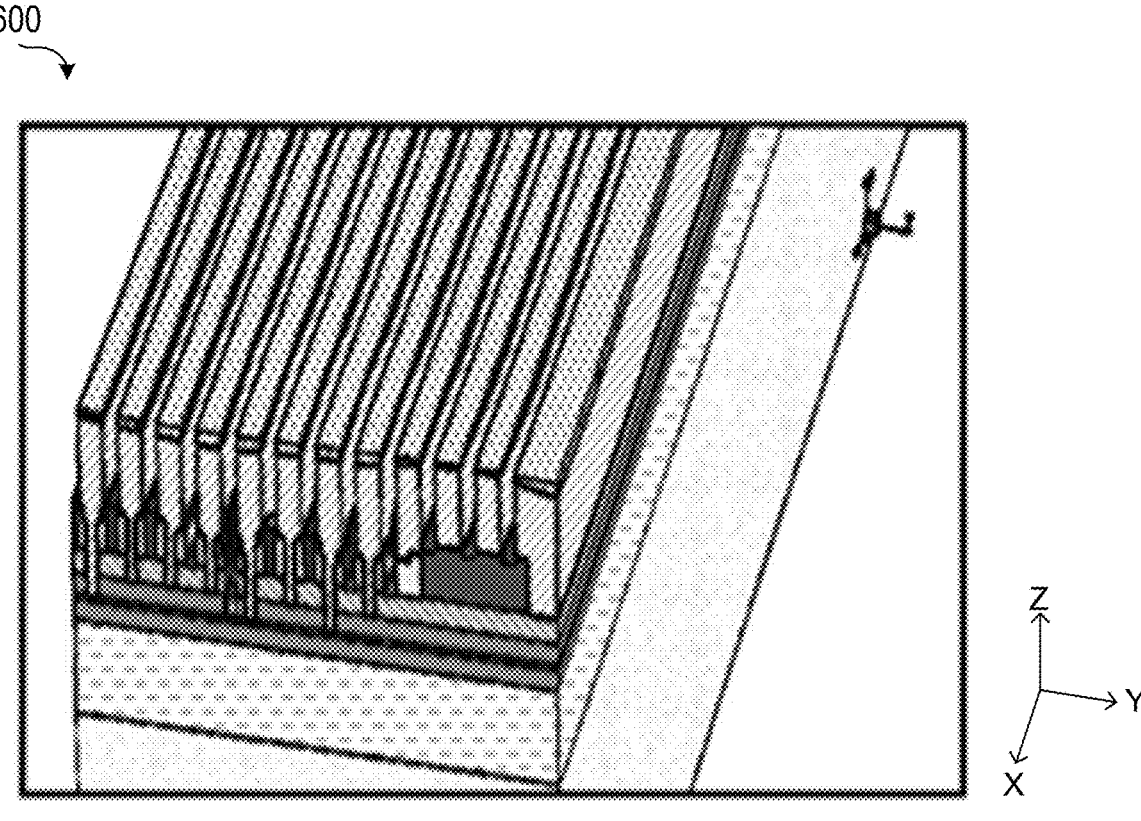
Figure 18A:
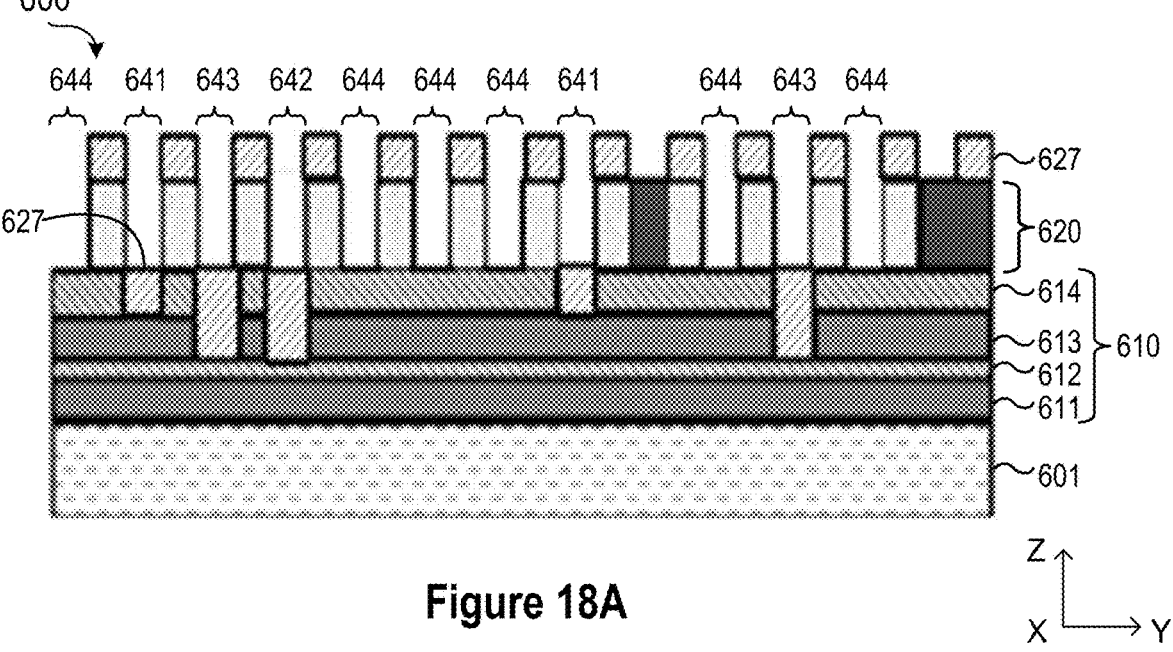

In FIGS. 18A and 18B, the anti-spacer pattern 635 is etched to uncover the fourth hardmask layer 614 in the fourth region 644. Meanwhile, the filler material 627 can at least partially remain in the first region 641, the second region 642 and the third region 643 to protect the hardmask layer stack 610 below.

In some embodiments, the SoC gap-fill material (e.g. 627) is again partially transferred such that the top silicon nitride hard-mask (e.g. 614) is revealed, but some level of SoC gap-fill (e.g. 627) is maintained within the top silicon nitride hard-mask stack (e.g. 614) in which the first set of M0 trenches (e.g. 641) have been memorized.

Note that at this step, the SoC gap-fill (e.g. 627) within the M0 trenches will need to be fully opened down to the top silicon nitride hard-mask film (e.g. 614) while maintaining some SoC gap-fill (e.g. 627) in the memorized first-set of M0 trenches (e.g. 641) memorized into the upper silicon nitride hard-mask film (e.g. 641) and the VCT structures (e.g. 642 and 643) which have been memorized with the upper TiN hard-mask film (e.g. 613).

It is possible at this step to use additional unit processing capabilities to improve the overall process variability of the etch process associated with the partial etch-transfer of the SoC gap-fill recess. For example, implementing a method in which all of the SoC gap-fill (e.g. 627) is removed at this step and then replaced with a particular type of area selective deposition (ASD) process in which some type of gap-fill will selectively deposit on the TiN hard-mask associated with the transfer point of the second set of VCT structures (e.g. 643). Likewise it is also possible to fully ash away the post-transferred SoC gap-fill and re-apply the SoC gap-fill material and systematically recess it down to the height in which the upper silicon nitride hard-mask film (e.g. 614) is fully revealed. It is also entirely possible in either of these aforementioned steps, that the recess of the SoG gap-fill material (e.g. 627) to only cover the top of the bottom silicon nitride hard-mask film (e.g. 612) and not cover the top of the top TiN hard-mask film (e.g. 613) from which the VCT structures (e.g. 642 and 643) have been transferred, thus allowing for the etch selectivity in the next process step to allow etch transfer of the second M0 pattern into the upper silicon nitride hard-mask stack (e.g. 614) without transfer-ring the VCT structures (e.g. 642 and 643) into the bottom silicon nitride hard-mask stack (e.g. 612). This will allow for some variability in the SoC gap-fill (e.g. 627) and subse-quent etch-recess process.

Figure 19B:
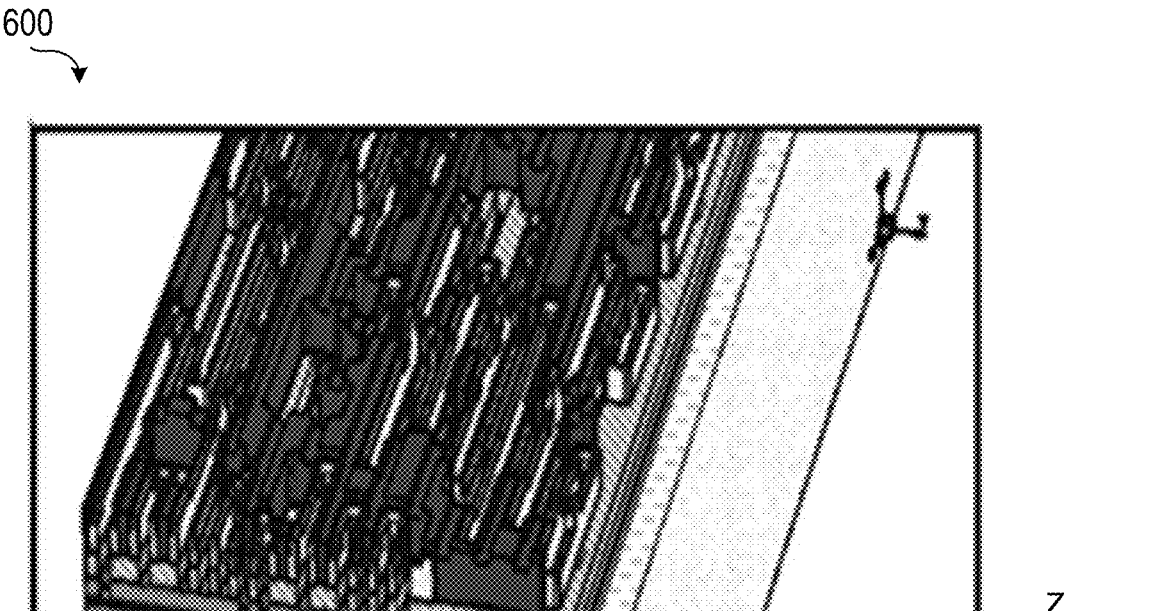
Figure 19A:
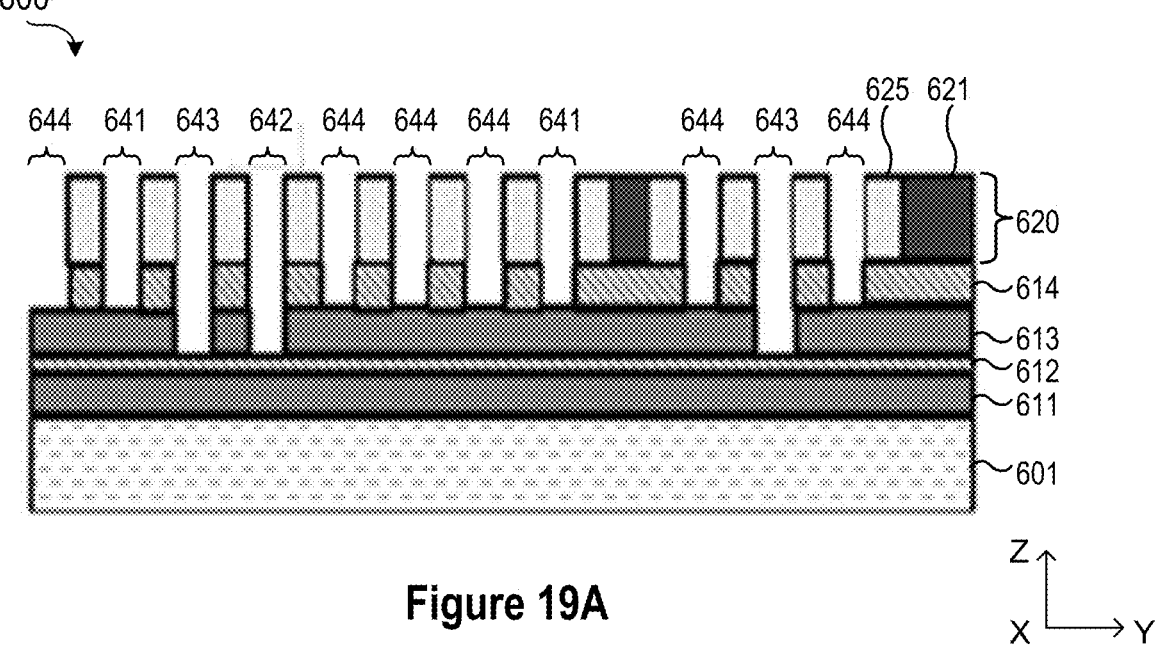

In FIGS. 19A and 19B, the fourth hardmask layer 614 is removed in the fourth region 644. Then, the filler material 627 can be removed from the first region 641, the second region 642 and the third region 643 as well as from above the trench pattern 620.

In some embodiments, the second M0 trench pattern (e.g. 644) can be transferred through anisotropic etch into the upper silicon nitride hard-mask film (e.g. 614) while the recessed SoC gap-fill (e.g. 627) is protecting the bottom silicon nitride hard-mask film (e.g. 612) from being etched. The cut (e.g. the filler material 627 above the trench pattern 620) for the second set of M0 trenches is preserved by the remaining amorphous silicon (e.g. 621) from the previous steps and this will prevent the unwanted transfer of the M0 pattern into the upper silicon nitride hard-mask (e.g. 614) film in the desired cut region.

After ashing of the SoC gap-fill material (e.g. 627), all intended M0 structures (e.g. 641 and 644) have been memorized only in the upper silicon nitride hard-mask film (e.g. 614) and all VCT structures (e.g. 642 and 643) have been memorized in the upper TiN hard-mask film (e.g. 613).

A lower hard-mask stack (e.g. 612 and 611) positioned underneath is typically identical or similar to an upper hard-mask stack (e.g. 614 and 613) in order for subsequent etch transfer steps incorporating anisotropic etch processes to be able to remove the used patterning stacks during the subsequent pattern transfer processes, although this is not required.

At this point in the integration, there are several unique "colors" in terms of etch selectivity where:

TiN:amorphous silicon=1.0 selectivity;
Amorphous silicon:TiN=1.0 selectivity;
Silicon oxide:Silicon nitride=1.0 selectivity;
Silicon nitride:silicon oxide=2.0 to 4.0 selectivity;
TiN:silicon nitride=10.0 selectivity;
Amorphous silicon:silicon nitride=10.0 selectivity;
TiN:silicon oxide=10.0 selectivity; and
Amorphous silicon:silicon oxide=10.0 selectivity.

FIGS. 17A-19A show one embodiment of etching the fourth hardmask layer 614 in the fourth region 644. In an alternative embodiment, the fourth hardmask layer 614 in FIG. 16A and can be etched using the trench pattern 620, which includes the mesa material 621 and the sidewall spacer structures 625, without forming the filler material 627 or the anti-spacer pattern 635. The second hardmask layer 612 may also be etched as a result.

Figure 20B:
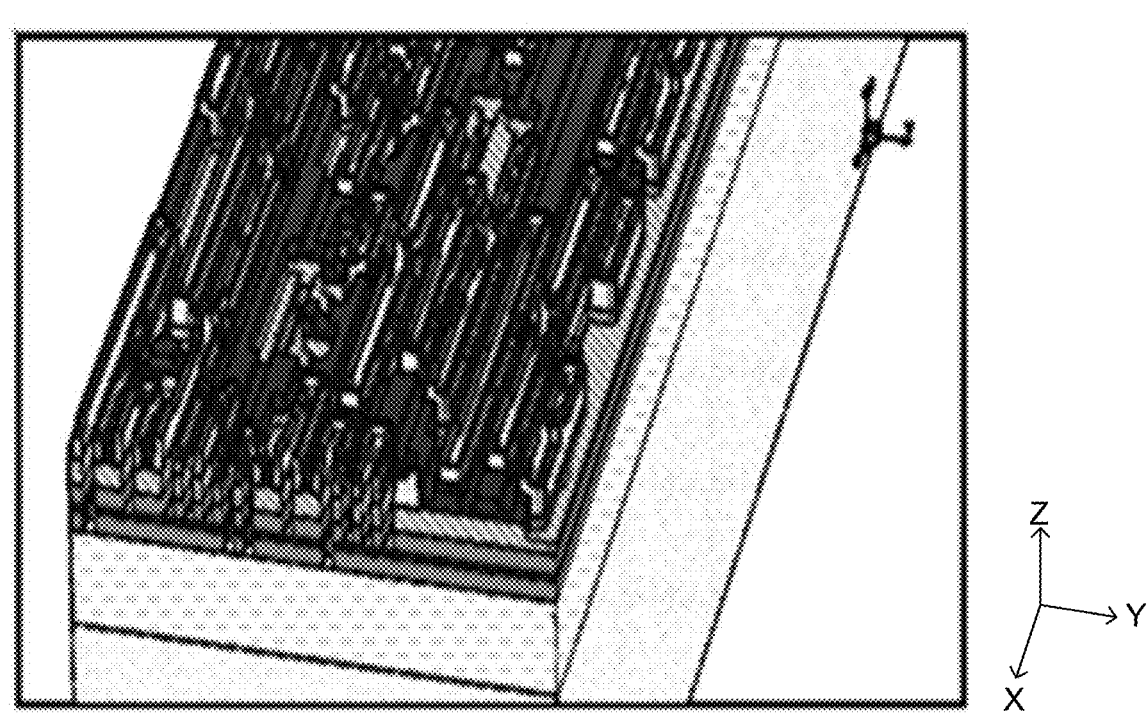
Figure 20A:
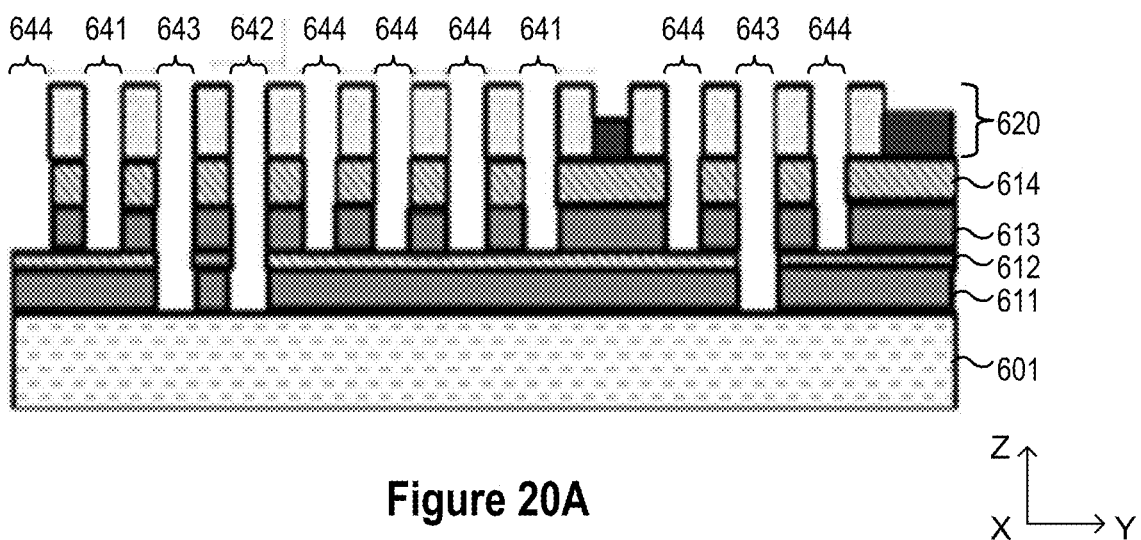

In FIGS. 20A and 20B, the second hardmask layer 612 and the first hardmask layer 611 are etched in the second region 642 and the third region 643. The third hardmask layer 613 is etched in the first region 641 and the fourth region 644.

In some embodiments, as a next step of the example process integration, the VCT and M0 structures (e.g. 641, 642 and 643 and 644) can be transferred down to the next level of hard-mask films (e.g. 612 and 611), meaning that the VCT structures (e.g. 642 and 643) will be transferred down through the bottom silicon nitride hard-mask and bottom TiN hard-mask films (e.g. 612 and 611) while the M0 trench pattern (e.g. 641 and 644) will be transferred down to the upper TiN hard-mask films (e.g. 613).

The etch selectivity as discussed above will provide that in the first silicon nitride etch, that some erosion of the silicon oxide spacer (e.g. 625) will be observed, but the spacer integrity will remain given the higher selectivity in etching silicon nitride with respect to silicon oxide driven by the lower binding energy of silicon nitride relative to silicon oxide, and also due to the height of the bottom silicon nitride hard-mask film (e.g. 612) being significantly less than that of the silicon oxide spacer (e.g. 625).

In the transfer etch through the bottom TiN hard-mask 1 for the VCT structures and the transfer etch through the upper TiN hard-mask (e.g. 613) for the M0 structures, this will likewise consume a good portion of the remaining amorphous silicon material which has been used to this point as a blocking material to define the cuts within the M0 patterns. Not all of the amorphous silicon will be consumed during this etch process.

In FIGS. 21A and 21B, via openings 651 are formed in the underlaying dielectric layer 601 in the second region 642 and the third region 643 and then filled with protective structures 653. The second hardmask layer 612 may be etched in the first region 641 and the fourth region 644 as well.

In some embodiments, the VCT structures (e.g. 642 and 643) can now be transferred into the low-k dielectric material (e.g. 601), which we assume in our example to be SiOCH with an option upper composition of TEOS or some harder silicon oxide film. This etch process will typically be on the order of 30-50 nm deep for a M0 trench pattern, considering how much low-k dielectric loss is expected in the final metal CMP process step for a dual damascene integration flow.

This amount of etching will also be expected to consume the remainder of the silicon oxide spacers (e.g. 625) and even potentially some of the top silicon nitride hard-mask film (e.g. 614). The bottom silicon nitride hard-mask film (e.g. 612) containing the memorized M0 structures (e.g. 641 and 644) will likewise be opened by this etch process but the bottom TiN hard-mask film (e.g. 611) underneath should serve as a good etch-stop to prevent the further transfer of the M0 structures (e.g. 641 and 644) down further into the stack. The hard-mask stack is setup in terms of selectivity to allow this to occur as TiN will have very good selectivity to any silicon oxide etch process and should be well maintained in this step.

A common practice is that once the low-k dielectric (e.g. 601) is opened and further etch transfer processing is required, that a gap-fill of SoC (e.g. 627) can be filled in and recessed down to open the upper hard-mask layers (e.g. 613 and 614) while protecting the bottom of the transferred VCT structures (e.g. 642 and 643) which at this point will be landing on some type of dielectric cap, whether this be a cap placed overtop a metal interconnect structure, or a contact-etch stop layer (CESL) for applications where we are connecting directly to a source and drain contact as opposed to a metallized interconnect connecting to the source and drain contact, or down to an etch-stop layer which will separate the BEOL from the MOL (middle-of-line). The recessed gap-fill (e.g. 627) will also protect the VCT structures (e.g. 642 and 643) from having any lateral CD growth during any of the subsequent etch processing steps.

In FIGS. 22A and 22B, the first hardmask layer 611 is etched in the first region 641 and the fourth region 644 to uncover the underlying dielectric layer 601.

In some embodiments, the M0 structures (e.g. 641 and 644) can now be transferred down to the lower TiN hard-mask film (e.g. 611) which will be used as the final M0 memorization film stack. During this etch process, some degree of over-etch can be employed to ensure that the residual amorphous silicon (e.g. 621) used in the second M0 blocking process is fully consumed by the anisotropic etch process.

In FIGS. 23A and 23B, the underlaying dielectric layer 601 in the first region 641 and the fourth region 644 can be etched to form trenches 655 using the (remaining) hardmask layer stack 610 as an etch mask. Note that the via openings 651 are deeper than the trenches 655 in the Z direction. Then, the protective structures 653 are removed from the via openings 651, and the (remaining) hardmask layer stack 610 are removed as well. In other words, the M0 pattern (e.g. 641 and 644) can now be transferred down into the low-k dielectric (e.g. 601). Typically there are two approaches to this.

In one embodiment, the initial VCT structures (e.g. 642 and 643) have been transferred down to some type of etch-selective cap, liner, or etch-stop layer, and subsequently filled with some type of gap-fill material from which any subsequent etching of the M0 pattern (e.g. 641 and 644) into the low-k dielectric (e.g. 601) will not damage the material on which the VCT structures (e.g. 642 and 643) have landed on. In this process, the M0 transfer into the low-k dielectric (e.g. 601) will not extend all the way down to said dielectric cap, liner, or etch-stop layer so that only the VCT structures (e.g. 642 and 643) will be connecting down to the interconnect metal or directly to the source and drain contact.

In another embodiment, the initial VCT structures (e.g. 642 and 643) have only been partially etched into the low-k dielectric (e.g. 601) in the previous steps, in which the SoC gap-fill material (e.g. 627) will then need to be removed so that the VCT structures (e.g. 642 and 643) will continue to grow as the M0 structures (e.g. 641 and 643) are transferred down into the low-k dielectric.

Both embodiments have been used in one way or another in dual damascene approaches. For this particular integration, the former embodiment is preferred where some SoC gap-fill material (e.g. 627) can be preserved, specifically for the purposes of protecting the bottom of the VCT structures (e.g. 642 and 643) while an isotropic or wet-etch process is used to remove the remaining silicon nitride and TiN hard-masks (e.g. 611, 612, 613 and 614) from the surface after the VCT and M0 patterns (e.g. 641, 642, 643 and 644) have been transferred into the low-k dielectric (e.g. 601).

It is also noted that it is possible to maintain the TiN hard-mask films (e.g. 611 and 613) at this step of the process, and to have it removed after the final metallization of the VCT and M0 structures (e.g. 641, 642, 643 and 644) in the post-metallization CMP process.

In FIGS. 24A and 24B, the via openings 651 and the trenches 655 are filled with metal material 657, which can be optionally planarized for example using CMP. For example, metallization can be performed which will fill the VCT and M0 structures (e.g. 641, 642, 643 and 644) with high-conductive metal.

Figure 25A:
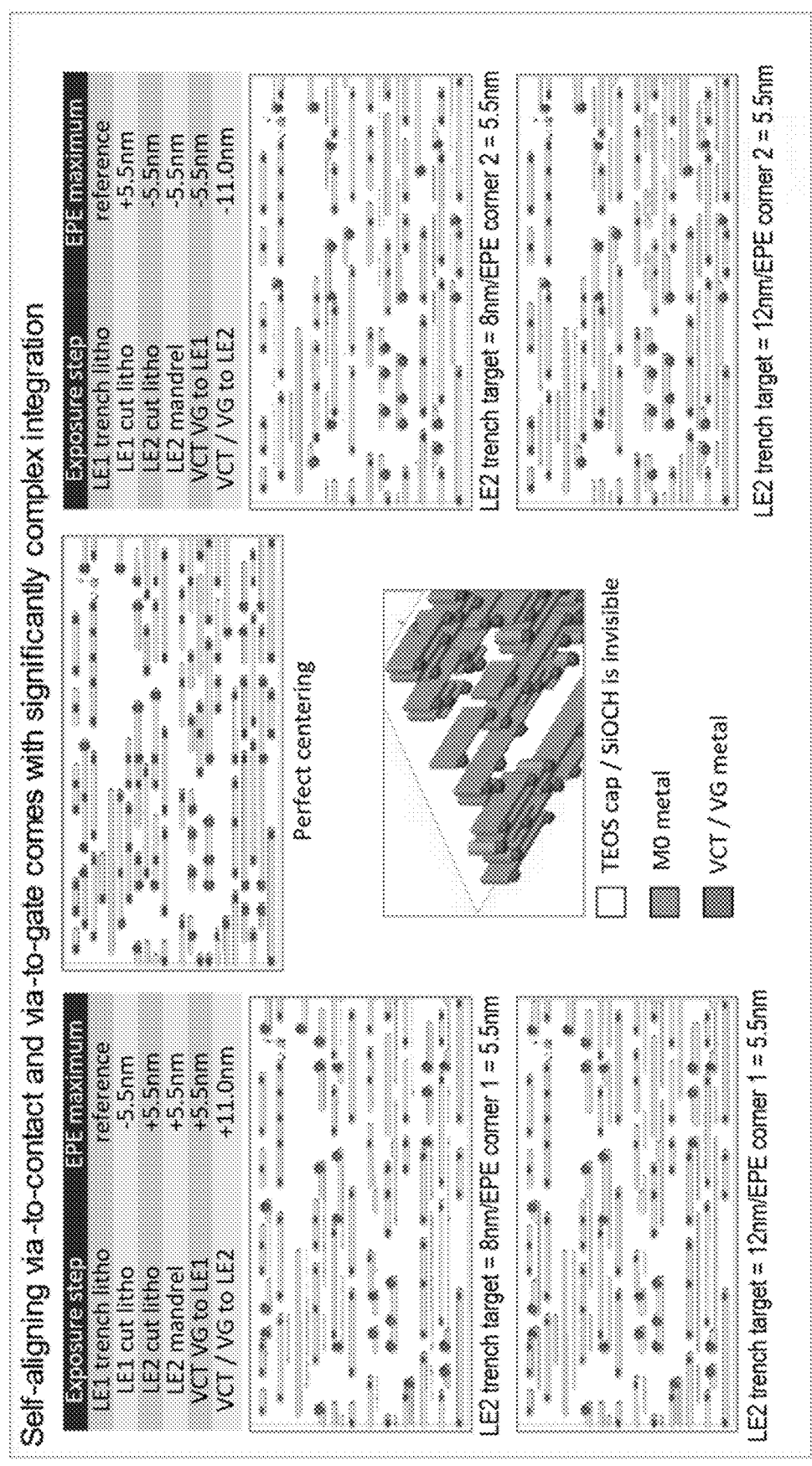
FIGS. 25A, 25B and 25C respectively show results with different EPEs, in accordance with some embodiments of the present disclosure.
Figure 25B:
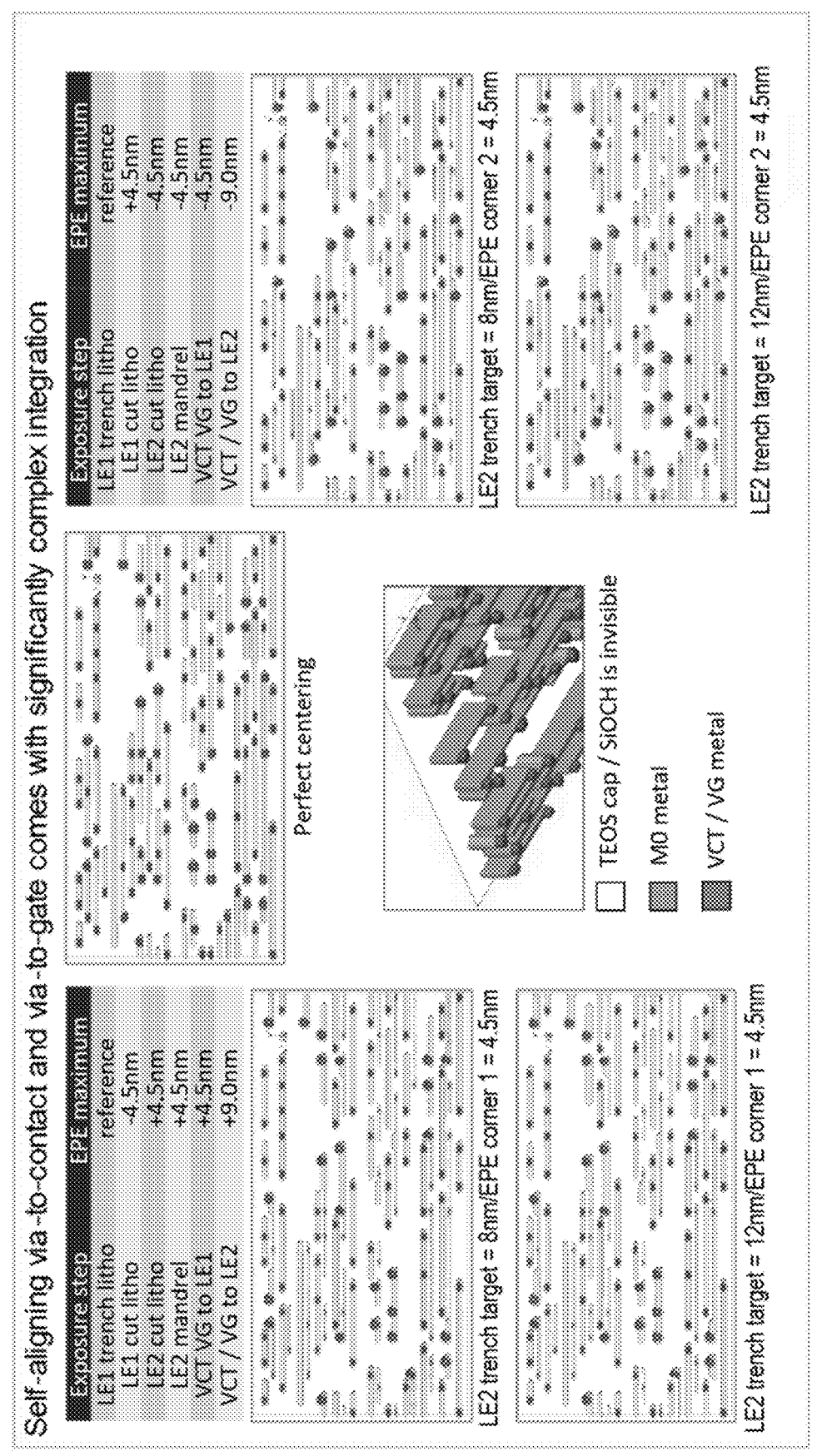
Figure 25C:
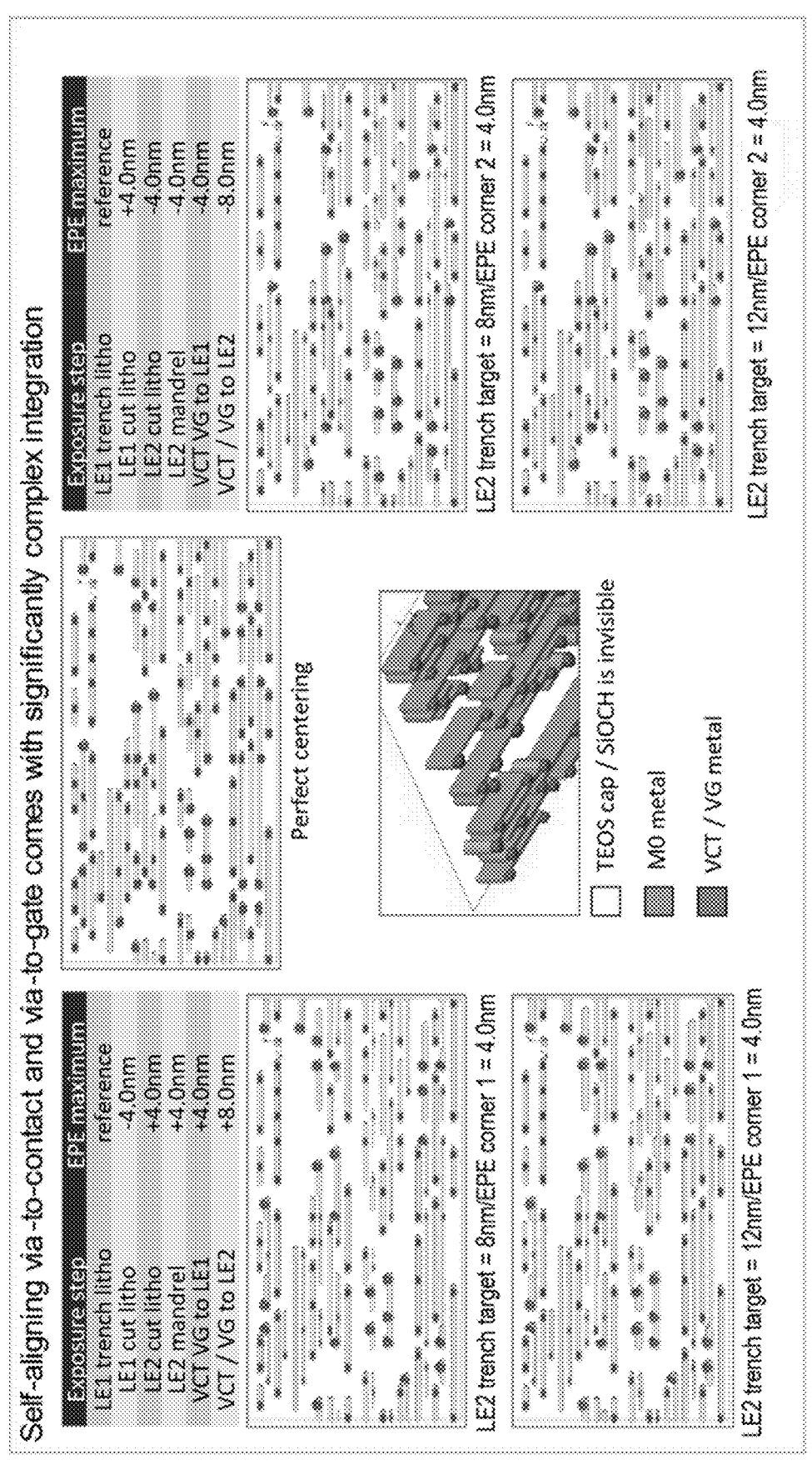

FIGS. 25A, 25B and 25C respectively show results with different EPEs, in accordance with some embodiments of the present disclosure. Specifically, in FIGS. 25A, 25B and 25C, EPE maximum is respectively set to be ±5.5 nm, ±4.5 nm and ±4.0 nm, similar to FIGS. 3A, 3B and 3C. As can be seen, when the same type of EPE corners is intentionally placed according to the techniques herein, for example using the process shown in FIGS. 6A-24A and 6B-24B, no active shorting of either VCT or VG structures to adjacent metal tracks can be observed, in contrast to FIGS. 3A, 3B and 3C.

Additionally, it should be understood that each of the first region 641, the second region 642, the third region 643 and the fourth region 644 can include one or more sub-regions. For example, in the cross-sectional view of FIG. 23A, the first region 641, the second region 642, the third region 643 and the fourth region 644 respectively include two, one, two and six sub-regions as shown. In some embodiments, a first set of M0 trenches, a first set of VCT structures, a second set of VCT structures and a second set of M0 trenches can be respectively formed in the first region 641, the second region 642, the third region 643 and the fourth region 644. As a result, the first set of M0 trenches, the first set of VCT structures, the second set of VCT structures and the second set of M0 trenches can respectively be referred to using numerals 641, 642, 643 and 644.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding.

Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of patterning for microfabrication, the method comprising:
   forming a hardmask layer stack over an underlaying dielectric layer, the hardmask layer stack comprising a first hardmask layer, a second hardmask layer formed over the first hardmask layer, a third hardmask layer formed over the second hardmask layer, and a fourth hardmask layer formed over the third hardmask layer, wherein the first hardmask layer and the third hardmask layer comprise a first hardmask material, the second hardmask layer and the fourth hardmask layer comprise a second hardmask material, and the first hardmask material and the second hardmask material are configured to be etch-selective to each other;
   forming a trench pattern over the hardmask layer stack, the trench pattern including sidewall spacer structures;
   etching the fourth hardmask layer in a first region;
   etching the fourth hardmask layer and the third hardmask layer in a second region;
   etching the fourth hardmask layer and the third hardmask layer in a third region;
   etching the fourth hardmask layer in a fourth region;

etching the second hardmask layer and the first hardmask layer in the second region and the third region;
   etching the third hardmask layer in the first region and the fourth region; and
   forming via openings in the underlaying dielectric layer in the second region and the third region, and trenches in the underlaying dielectric layer in the first region and the fourth region, wherein the via openings are deeper than the trenches.

2. The method of claim 1, further comprising:
   forming a first top pattern over the trench pattern, the first top pattern and the trench pattern forming a first composite etch mask; and
   etching the fourth hardmask layer in the first region and the second region using the first composite etch mask.

3. The method of claim 2, further comprising:
   removing the first top pattern;
   forming a second top pattern over the trench pattern, the second top pattern and the trench pattern forming a second composite etch mask; and
   etching the third hardmask layer in the second region using the second composite etch mask.

4. The method of claim 3, further comprising:
   removing the second top pattern;
   forming a third top pattern over the trench pattern, the third top pattern and the trench pattern forming a third composite etch mask; and
   etching the fourth hardmask layer and the third hardmask layer in the third region using the third composite etch mask.

5. The method of claim 4, further comprising:
   removing the third top pattern;
   forming a fourth top pattern over the trench pattern, the fourth top pattern and the trench pattern forming a fourth composite etch mask; and
   uncovering the fourth hardmask layer in the fourth region using the fourth composite etch mask.

6. The method of claim 5, further comprising:
   forming an anti-spacer pattern over the trench pattern; and
   etching the anti-spacer pattern to uncover the fourth hardmask layer in the fourth region before the fourth hardmask layer is etched in the fourth region.

7. The method of claim 6, further comprising:
   etching the fourth hardmask layer in the fourth region using the anti-spacer pattern.

8. The method of claim 4, further comprising:
   forming a filler material within and over the trench pattern, after the removing the second top pattern and before the forming the third top pattern.

9. The method of claim 8, further comprising:
   partially etching the filler material using the second top pattern such that the trench pattern is uncovered in the third region; and
   etching the trench pattern in the third region to uncover the fourth hardmask layer in the third region.

10. The method of claim 8, wherein:
   the filler material comprises a spin-on-carbon film.

11. The method of claim 1, further comprising:
   filling the via openings with protective structures before the trenches are formed; and
   removing the protective structures from the via openings after the trenches are formed.

12. The method of claim 11, further comprising:
   etching the second hardmask layer and the first hardmask layer in the first region and the fourth region; and
   etching the underlaying dielectric layer in the first region and the fourth region to form the trenches.

13. The method of claim 1, further comprising:

removing the hardmask layer stack after the via openings and the trenches are formed.

14. The method of claim 1, further comprising:

transferring an opening pattern formed in the hardmask layer stack through the underlaying dielectric layer to form the via openings; and transferring another opening pattern formed in the hardmask layer stack partially into the underlying dielectric layer to form the trenches.

15. The method of claim 1, further comprising:

filling the via openings and the trenches with metal material.

16. The method of claim 15, wherein:

the metal material has spacings equal to widths of the sidewall spacer structures.

17. The method of claim 15, wherein:

the metal material has a pitch of 22 nm or smaller, and a total edge placement error is over one fourth of the pitch of the metal material.

18. The method of claim 1, wherein:

the first hardmask material is titanium nitride, and the second hardmask material is silicon nitride.

19. The method of claim 1, wherein:

the trench pattern comprises a mesa material of amorphous silicon, and the sidewall spacer structures comprise silicon oxide.

20. The method of claim 1, wherein:

the trench pattern has a thickness larger than individual layers of the hardmask layer stack.

* * * * *